(12) United States Patent
Li et al.

(10) Patent No.: US 12,243,741 B2
(45) Date of Patent: Mar. 4, 2025

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Johnny Chiahao Li, Hsinchu (TW); Shih-Ming Chang, Hsinchu County (TW); Ken-Hsien Hsieh, Taipei (TW); Chi-Yu Lu, New Taipei (TW); Yung-Chen Chien, Kaohsiung (TW); Hui-Zhong Zhuang, Kaohsiung (TW); Jerry Chang Jui Kao, Taipei (TW); Xiangdong Chen, San Diego, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 106 days.

(21) Appl. No.: 17/674,674

(22) Filed: Feb. 17, 2022

(65) Prior Publication Data

US 2023/0260786 A1    Aug. 17, 2023

(51) Int. Cl.
*H01L 21/027* (2006.01)
*H01L 21/02* (2006.01)
*H01L 21/306* (2006.01)
*H01L 21/762* (2006.01)
*H01L 23/498* (2006.01)
*H01L 23/522* (2006.01)

(52) U.S. Cl.
CPC ...... *H01L 21/027* (2013.01); *H01L 21/02697* (2013.01); *H01L 21/30604* (2013.01); *H01L 21/762* (2013.01); *H01L 23/49827* (2013.01); *H01L 23/522* (2013.01)

(58) Field of Classification Search
None
See application file for complete search history.

(56) References Cited

U.S. PATENT DOCUMENTS

| 8,796,666 | B1 | 8/2014 | Huang et al. |
| 9,012,132 | B2 | 4/2015 | Chang |
| 9,028,915 | B2 | 5/2015 | Chang et al. |
| 9,093,530 | B2 | 7/2015 | Huang et al. |
| 9,146,469 | B2 | 9/2015 | Liu et al. |
| 9,213,234 | B2 | 12/2015 | Chang |

(Continued)

*Primary Examiner* — Alexander G Ghyka
(74) *Attorney, Agent, or Firm* — WPAT LAW; Anthony King

(57) ABSTRACT

A method includes forming a conductive member over a first conductive line; forming a second conductive line over the conductive member; and removing a portion of the conductive member exposed by the second conductive line to form a conductive via. The formation of the second conductive line is implemented prior to the formation of the conductive via. A semiconductor structure includes a first conductive line having a first surface; a second conductive line disposed above the first conductive line and having a second surface overlapping the first surface; and a conductive via electrically connected to the first surface and the second surface. The conductive via includes a first end disposed within the first surface, a second end disposed within the second surface, and a cross-section between the first end and the second end, wherein at least two of interior angles of the cross-section are substantially unequal to 90°.

20 Claims, 37 Drawing Sheets

(56) References Cited

U.S. PATENT DOCUMENTS

| | | |
|---|---|---|
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2018/0158694 A1* | 6/2018 | Lin .................. H01L 21/76816 |

* cited by examiner

SEMICONDUCTOR STRUCTURE AND METHOD FOR FORMING THE SAME

BACKGROUND

Recent trends in miniaturizing integrated circuits (ICs) have resulted in smaller devices and improvements in integration densities of a variety of components (e.g., transistors, resistors, capacitors, etc.). The devices are often connected by conductive traces, such as metal lines and polysilicon lines, and conductive vias to form circuits. The conductive traces and conductive vias are formed by photolithographic processes that include use of photoresists, photolithographic masks, specialized light sources, and various etchants.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
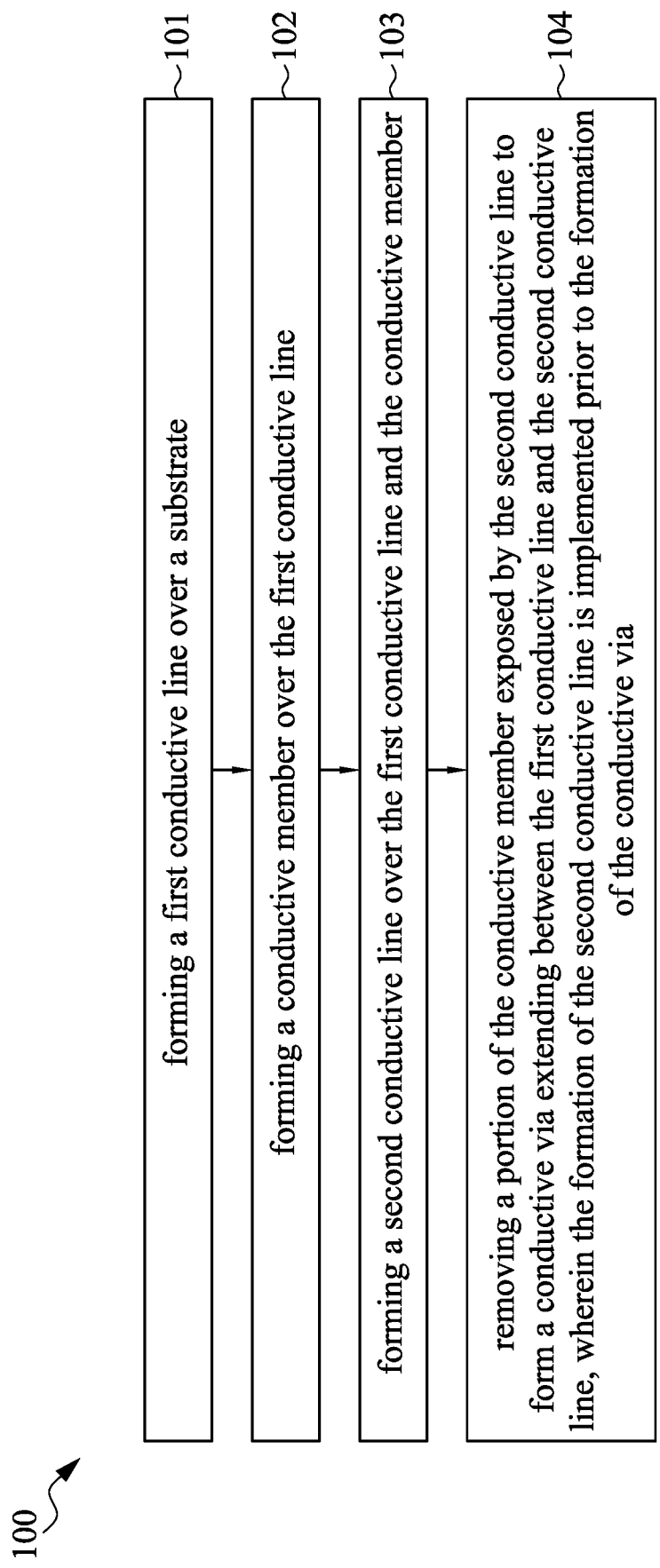
FIG. 1 illustrates a flowchart of a method, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

When fabricating a circuit or packing a wafer, components need to be electrically connected. As demand for smaller electronic devices has increased, a need for smaller and more creative electrical connecting techniques of semiconductor structures has emerged. An example of such electrical connecting techniques is providing a conductive via disposed between and electrically connected to a first metal line and a second metal line over the first metal line.

In the present disclosure, a method of manufacturing a semiconductor structure is disclosed. In some embodiments, a semiconductor structure is manufactured by the method. In some embodiments, an interconnect structure is manufactured by the method. The method includes a number of operations and the description and illustrations are not deemed as a limitation of the sequence of the operations.

FIG. 1 illustrates a flowchart of a method 100 of manufacturing a semiconductor structure, in accordance with some embodiments. In some embodiments, as shown in FIG. 1, the method 100 includes the following steps. Step 101 includes forming a first conductive line over a substrate. Step 102 includes forming a conductive member over the first conductive line. Step 103 includes forming a second conductive line over the first conductive line and the conductive member. Step 104 includes removing a portion of the conductive member exposed by the second conductive line to form a conductive via extending between the first conductive line and the second conductive line. The formation of the second conductive line is implemented prior to the formation of the conductive via.

Figure 2:
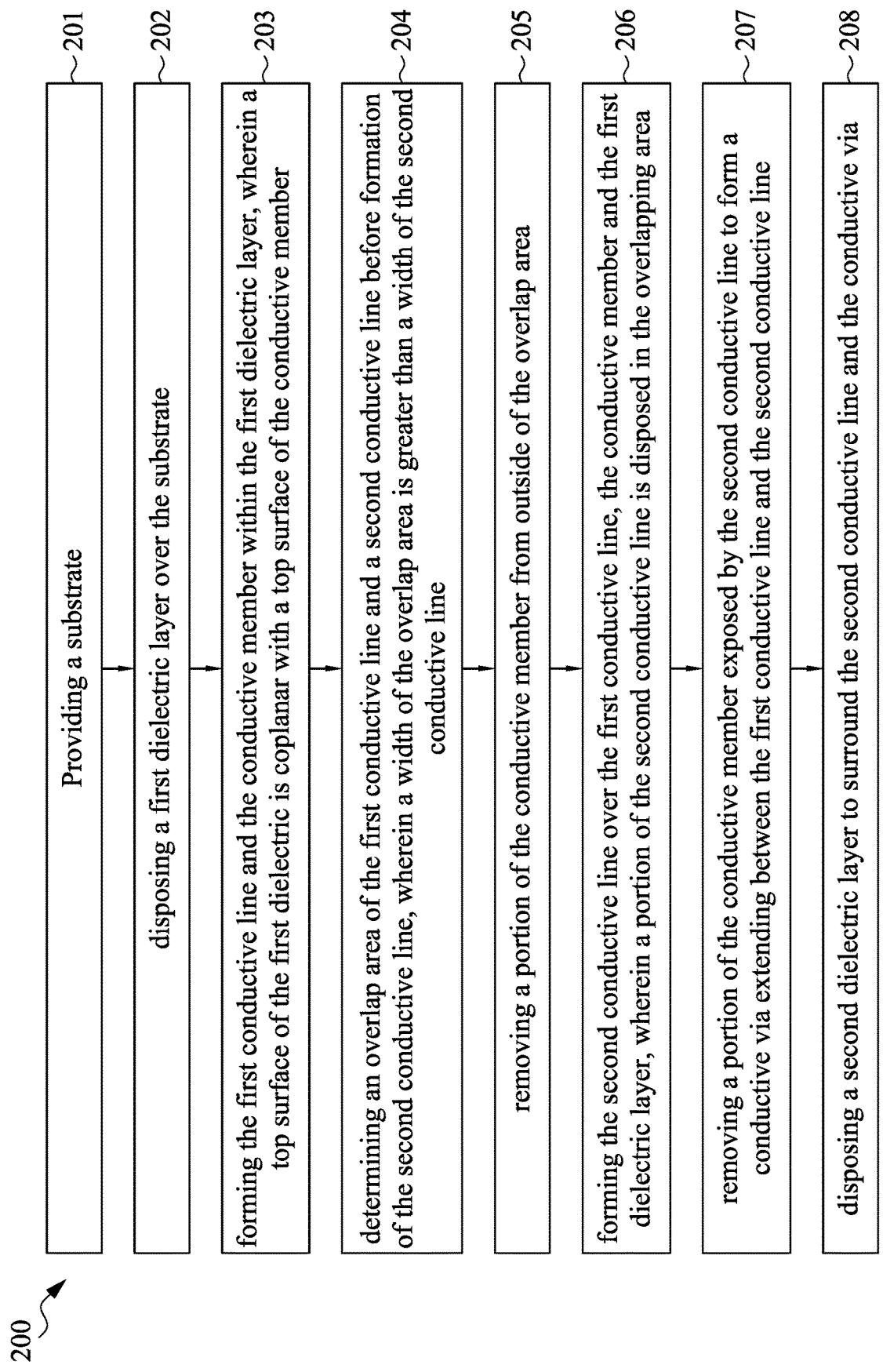
FIG. 2 illustrates a flowchart of a method, in accordance with some embodiments of the present disclosure.

FIG. 2 illustrates a flowchart of a method 200 of manufacturing a semiconductor structure, in accordance with some embodiments. Additional steps can be provided before, during, and after the steps shown in FIGS. 1 and 2, and some of the steps described below can be replaced or eliminated in other embodiments of the method 100 and the method 200. The order of the steps may be interchangeable. FIGS. 3 to 14 are schematic perspective views illustrating exemplary operations for the methods of manufacturing a semiconductor structure, such as the operations illustrated in FIGS. 1 and 2, according to one embodiment of the present disclosure.

Figure 3:
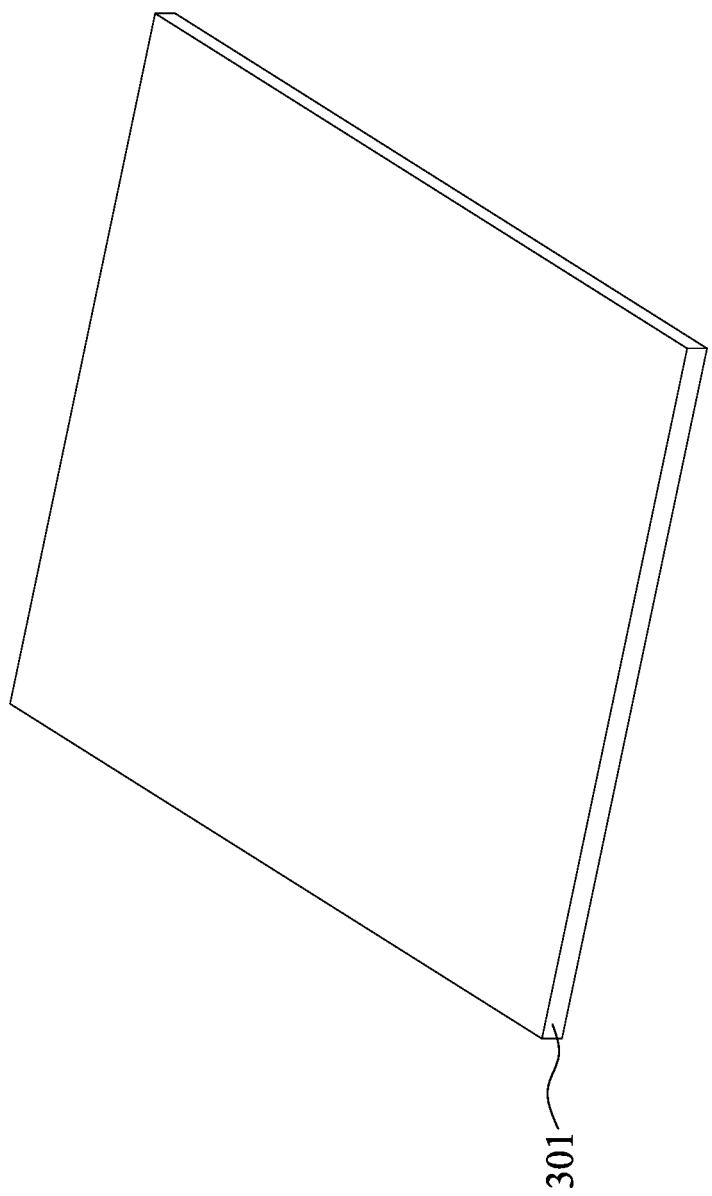
FIGS. 3 to 14 are perspective views illustrating exemplary operations in a method of manufacturing a semiconductor structure, in accordance with some embodiments of the present disclosure.

Referring to FIGS. 2 and 3, in some embodiments, the method 200 includes step 201, which includes providing a substrate 301. The substrate 301 may be processed according to applicable manufacturing processes to form integrated circuits in the substrate 301. In some embodiments, the substrate 301 is a semiconductor substrate, such as a bulk semiconductor, a semiconductor-on-insulator (SOI) substrate, or the like, and may be doped (e.g., with a p-type or an n-type dopant) or undoped. The substrate 301 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrate 301 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In an embodiment, the substrate 301 is a silicon wafer.

Devices, such as transistors, diodes, capacitors, resistors, etc., may be formed in and/or on the substrate 301 and may be interconnected by metal layers formed by, for example, metallization patterns in one or more dielectric layers on the substrate 301 to form an interconnect structure.

Figure 4:
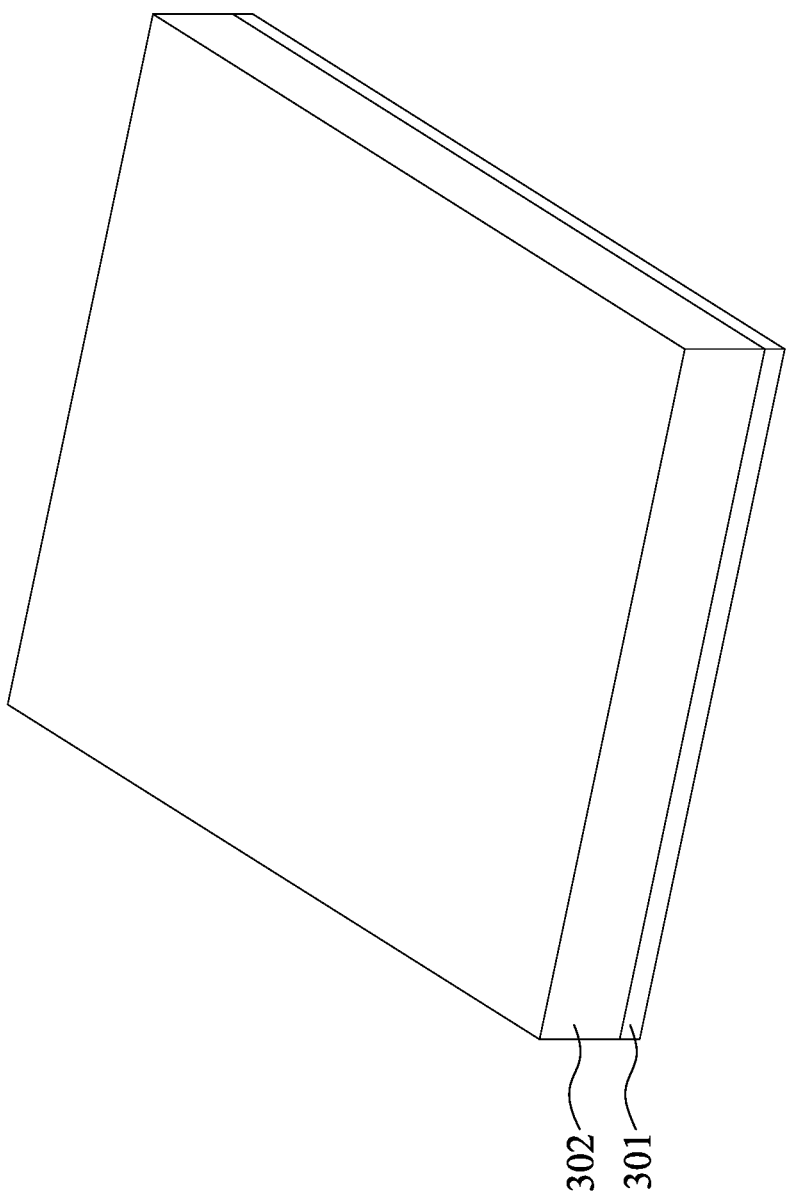

Referring to FIGS. 2 and 4, the method 200 includes step 202, which includes disposing a first dielectric layer 302 over the substrate 301. In some embodiments, the first dielectric layer 302 is an inter-metal dielectric (IMD).

In some embodiments, the dielectric layer 302 includes low-k dielectric material. The dielectric constant (k value) of the low-k dielectric material may be less than 3.0, or less than about 2.5, and the dielectric material is therefore also referred to as an extreme low-k (ELK) dielectric material. In some embodiments, the dielectric layer 302 includes a polymer, such as polyimide, polybenzoxazole (PBO), benzocyclobutene (BCB), ajinomoto buildup film (ABF), solder resist film (SR), or the like. In some embodiments, the dielectric layer 302 is a single layer or multiple layers stacked over each other. In some embodiments, the dielectric layer 302 includes a plurality of dielectric sub-layers disposed over the substrate 301. In some embodiments, the materials included in the dielectric sub-layers are the same material or different materials. In some embodiments, the dielectric layer 302 is formed by suitable fabrication techniques such as spin coating, chemical vapor deposition (CVD), plasma-enhanced chemical vapor deposition (PECVD), or the like.

Figure 5:
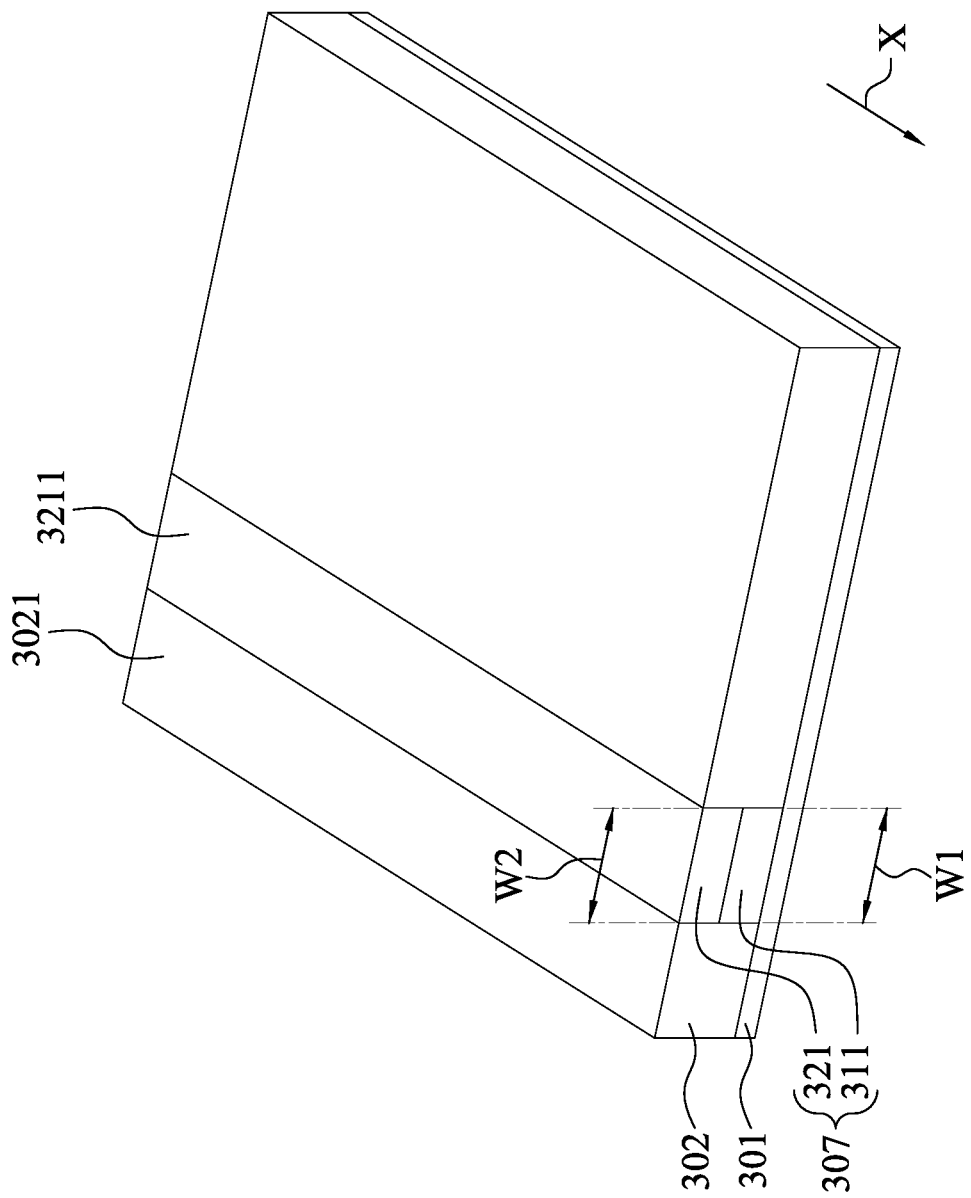

Referring to FIGS. 2 and 5, the method 200 includes step 203, which includes forming a first conductive line 311 and a conductive member 321 within the first dielectric layer 302, wherein a top surface 3021 of the first dielectric layer 302 is coplanar with a top surface 3211 of the conductive member 321. The respective process is illustrated as step 101 and step 102 in the method 100 as shown in FIG. 1.

In some embodiments, the top surface 3211 of the conductive member 321 is exposed through the first dielectric layer 302. In some embodiments, in step 203, a stack 307 including the first conductive line 311 and the conductive member 321 over the first conductive line 311 is formed. In some embodiments, the conductive member 321 is disposed over the first conductive line 311, and the first dielectric layer 302 surrounds the first conductive line 311 and the conductive member 321. In some embodiments, the conductive member 321 overlaps and is parallel to the first conductive line 311. In some embodiments, a width W2 of the conductive member 321 is substantially equal to a width W1 of the first conductive line 311. In some embodiments, the first conductive line 311 and the conductive member 321 extend along a first direction X.

Each of the first conductive line 311 and the conductive member 321 may include conductive material such as aluminum or aluminum copper alloy. The first conductive line 311 is electrically coupled to the conductive member 321. In some embodiments, the first conductive line 311 is electrically coupled to respective circuits of the substrate 301. In some embodiments, the first conductive line 311 is formed on an active side of the substrate 301. A shape of the first conductive line 311 from a top view perspective is not particularly limited, and may be, for example, a strip, an arc shape, or the like, and may be adjusted according to the actual needs. In some embodiments, a plurality of the first conductive lines 311 are formed over the substrate 301.

Figure 6:
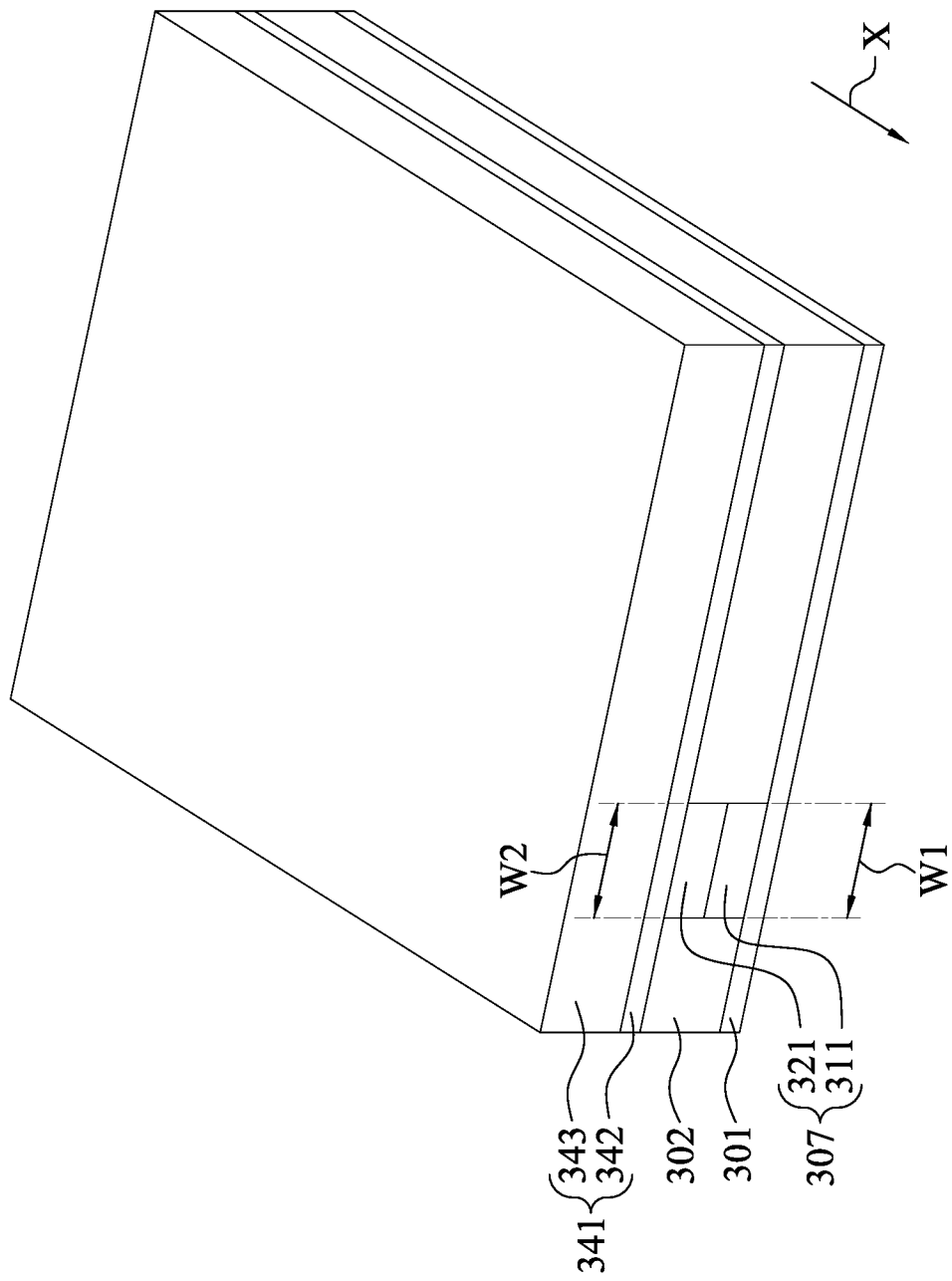

Referring to FIG. 6, the method 200 further includes disposing a multi-layer etching mask 341 over the first dielectric layer 302 and the conductive member 321. The multi-layer etching mask 341 is formed over first dielectric layer 302 and the stack 307. In some embodiments, the multi-layer etching mask 341 is a hard mask. The multi-layer etching mask 341 may be formed of a metallic material, such as titanium nitride, titanium, tantalum nitride, or tantalum. The multi-layer etching mask 341 may be formed of metal-doped carbide (e.g., tungsten carbide) or a metalloid (e.g., silicon nitride, boron nitride or silicon carbide). The multi-layer etching mask 341 may be formed using CVD, PVD, atomic layer deposition (ALD), or the like. In some embodiments, the multi-layer etching mask 341 is initially patterned and then the conductive member 321 is etched with the multi-layer etching mask 341 as an etching mask. The pattern of the multi-layer etching mask 341 is transferred to the conductive member 321 accordingly.

In some embodiments, the multi-layer etching mask 341 may include a lower layer 342 and an upper layer 343. The lower layer 342 may include a cross-linked photoresist or a hard mask. The upper layer 343 may include a photoresist, which is exposed and developed to define an overlap area (not shown). In some embodiments, the multi-layer etching mask 341 further includes a middle layer (not shown) disposed between the lower layer 342 and the upper layer 343 and including an inorganic material such as silicon oxynitride or the like.

Figure 7:
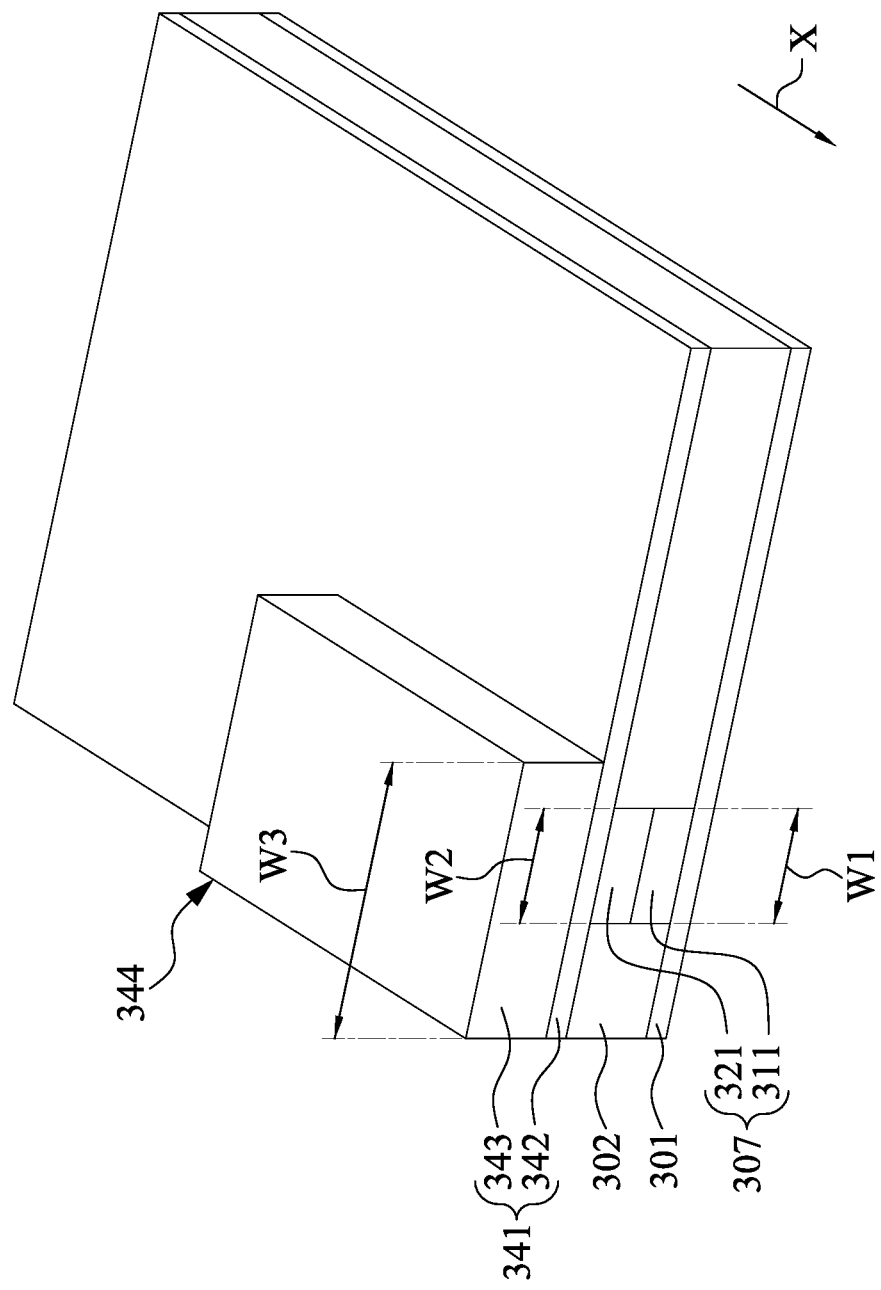

Referring to FIGS. 2 and 7, the method 200 includes step 204, which includes determining an overlap area 344 of the first conductive line 311 and a second conductive line (not shown) before formation of the second conductive line (not shown). The overlap area 344 overlaps the first conductive line 311. A width W3 of the overlap area 344 is greater than a width of the subsequently-formed second conductive line. In some embodiments, the width W3 of the overlap area 344 is greater than the width W2 of the conductive member 321. In some embodiments, a plurality of overlap areas 344 overlap the first conductive line 311.

In some embodiments, the method 200 further includes patterning the upper layer 343, and the remaining portion of the upper layer 343 defines the overlap area 344. In some embodiments, a portion of the lower layer 342 is exposed after patterning the upper layer 343. In some embodiments, the upper layer 343 is patterned by an etchant. In some embodiments, the upper layer 343 and the middle layer are patterned. In some embodiments, the method 200 further includes lithography process.

Figure 8:
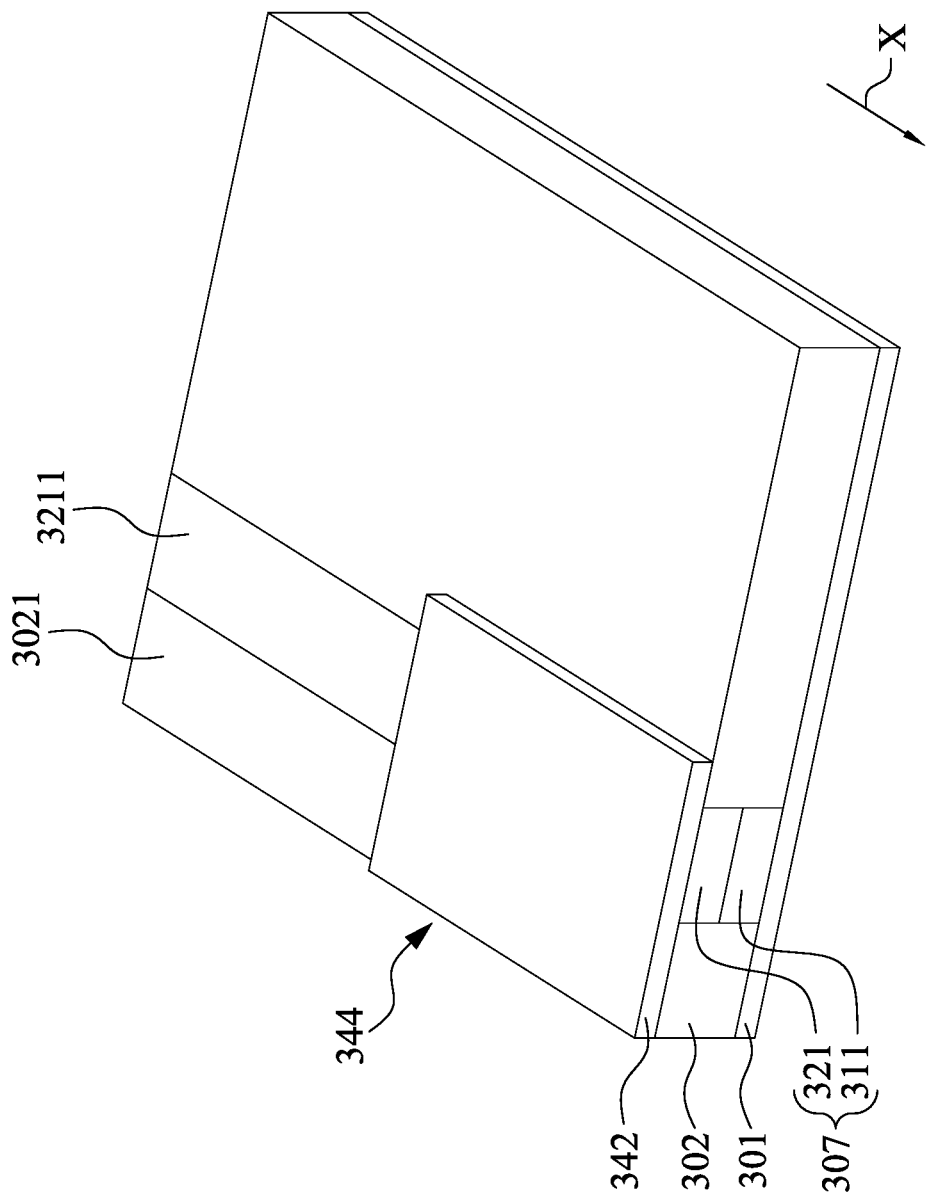

Referring to FIGS. 2 and 8, the method 200 further includes patterning the lower layer 342, and a remaining portion of the lower layer 342 defines the overlap area 344. In some embodiments, the lower layer 342 is patterned by an etchant. In some embodiments, a portion of the conductive member 321 disposed outside of the overlap area 344 is exposed. In some embodiments, the remaining portions of the lower layer 342 are then used to pattern the underlying conductive member 321.

Figure 9:
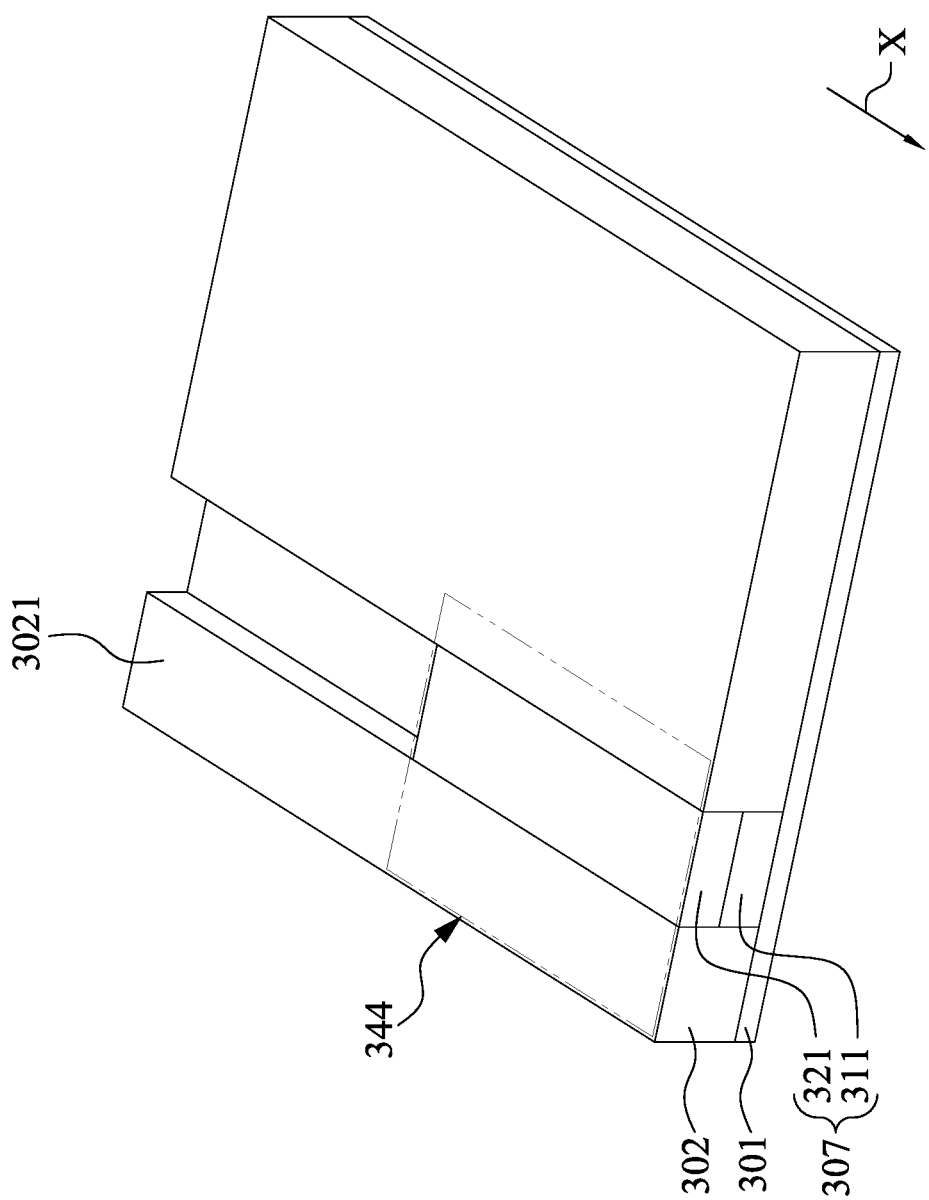

In some embodiments, referring to FIGS. 2 and 9, the method 200 includes step 205, which includes removing a portion of the conductive member 321 from outside of the overlap area 344. In some embodiments, the remaining conductive member 321 is disposed in the overlap area 344. In some embodiments, a portion of the first conductive line 311 disposed outside of the overlap area 344 is exposed.

Figure 10:
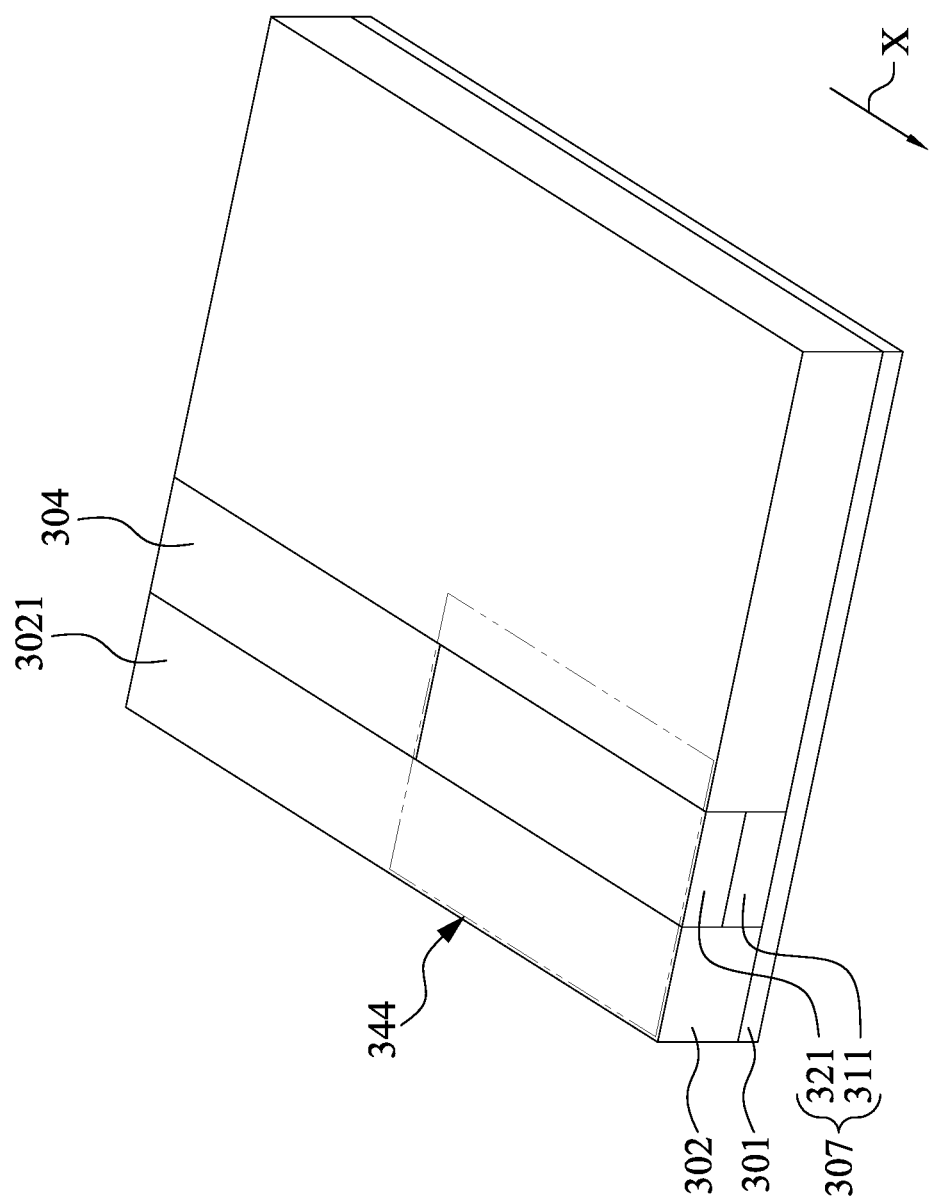

In some embodiments, referring to FIG. 10, the method 200 includes disposing a dielectric layer 304 over the first conductive line 311. In some embodiments, the dielectric layer 304 is disposed outside of the overlap area 344. In some embodiments, the dielectric layer 304 is disposed adjacent to the remaining conductive member 321, and the top surface 3021 of the first dielectric layer 302 is coplanar with a top surface of the dielectric layer 304. In some embodiments, the dielectric layer 304 includes a low-k dielectric material. In some embodiments, a material included in the dielectric layer 304 and a material included in the first dielectric layer 302 are a same material or different materials.

Figure 11:
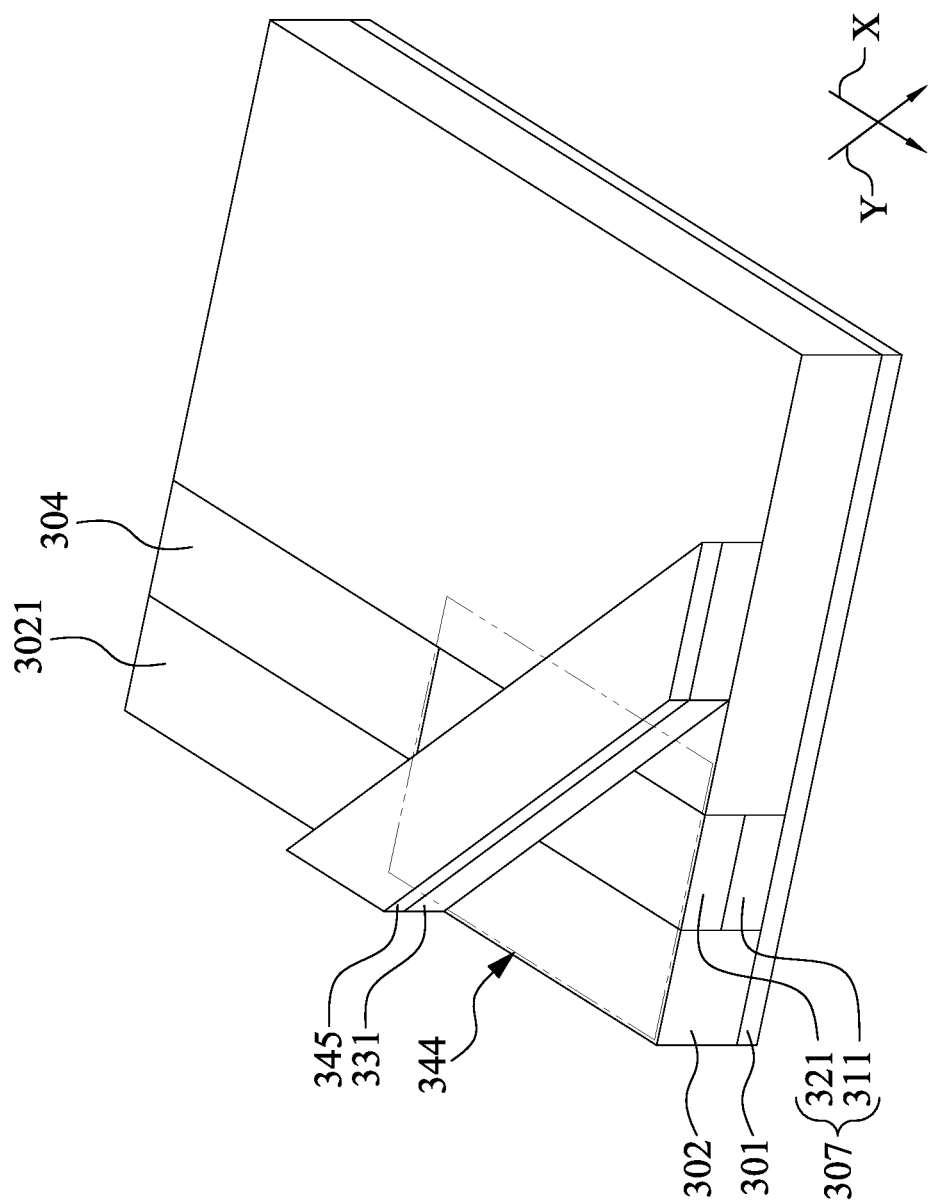

In some embodiments, referring to FIGS. 2 and 11, the method 200 includes step 206, which includes forming the second conductive line 331 over the first conductive line 311, the conductive member 321 and the first dielectric layer 302, wherein a portion of the second conductive line 331 is disposed in the overlap area 344. The respective process is illustrated as step 103 in the method 100 as shown in FIG. 1. In some embodiments, a portion of the conductive member 321 is exposed through the second conductive line 331. In some embodiments, the second conductive line 331 is separated from the dielectric layer 304. In some embodiments, a portion of the second conductive line 331 is disposed over the dielectric layer 304.

The second conductive line 331 extends along a second direction Y different from the first direction X. In some embodiments, the first direction X and the second direction Y are not orthogonal to each other from a top view perspective. In some embodiments, the first conductive line 311 and the second conductive line 331 are not orthogonal to each other. In some embodiments, the first conductive line 311 and the second conductive line 331 are orthogonal to each other.

In some embodiments, a mask 345 is disposed over the second conductive line 331. In some embodiments, the mask 345 is a hard mask. In some embodiments, the mask 345 overlaps and is parallel to the second conductive line 331. The mask 345 may be formed by CVD, PVD, atomic layer deposition (ALD), or the like. In some embodiments, the mask 345 is disposed over a conductive layer (not shown) over the remaining conductive member 321 and the first dielectric layer 302, the mask 345 is initially patterned, and the conductive layer (not shown) is etched with the mask 345 as an etching mask. The pattern of the multi-layer etching mask 341 is transferred to the conductive member 321 accordingly.

Figure 12:
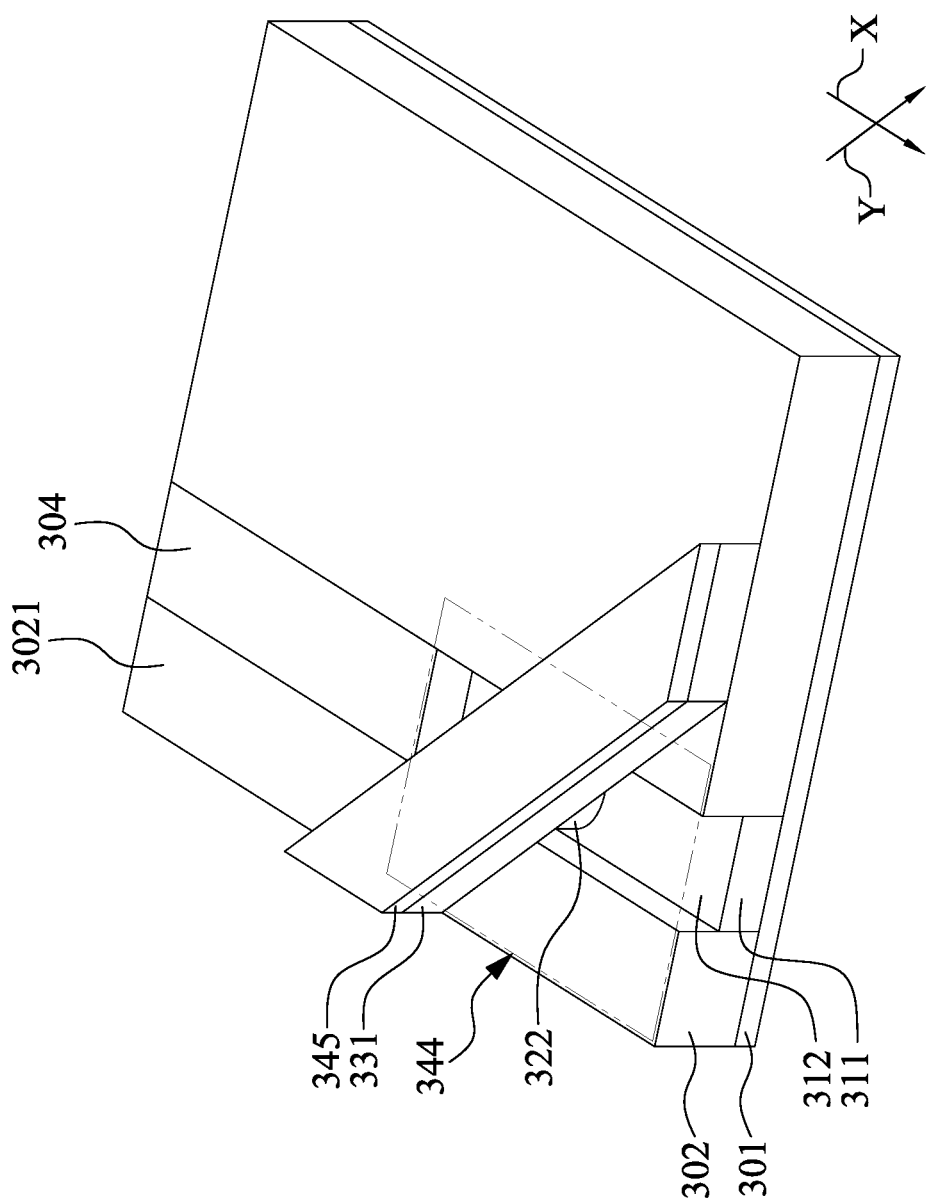

In some embodiments, referring to FIGS. 2 and 12, the method 200 includes step 207, which includes removing a portion of the conductive member 321 exposed by the second conductive line 331 to form a conductive via 322 extending between the first conductive line 311 and the second conductive line 331. The respective process is illustrated as step 104 in the method 100 as shown in FIG. 1. The formation of the second conductive line 331 is implemented prior to the formation of the conductive via 322. The portion of the conductive member 321 is removed after the formation of the second conductive line 331. In some embodiments, a portion 312 of the first conductive line 311 is exposed by the conductive via 322. In some embodiments, the portion 312 surrounds the conductive via 322 from a top view perspective. In some embodiments, the conductive via 322 is isolated from the first dielectric layer 302. In some embodiments, the conductive via 322 is in contact with the first dielectric layer 302.

In some embodiments, the conductive via 322 is disposed in the overlap area 344, and the second conductive line 331 is disposed over the conductive via 322. In some embodiments, the conductive via 322 is electrically connected to the first conductive line 311 and the second conductive line 331.

Figure 13:
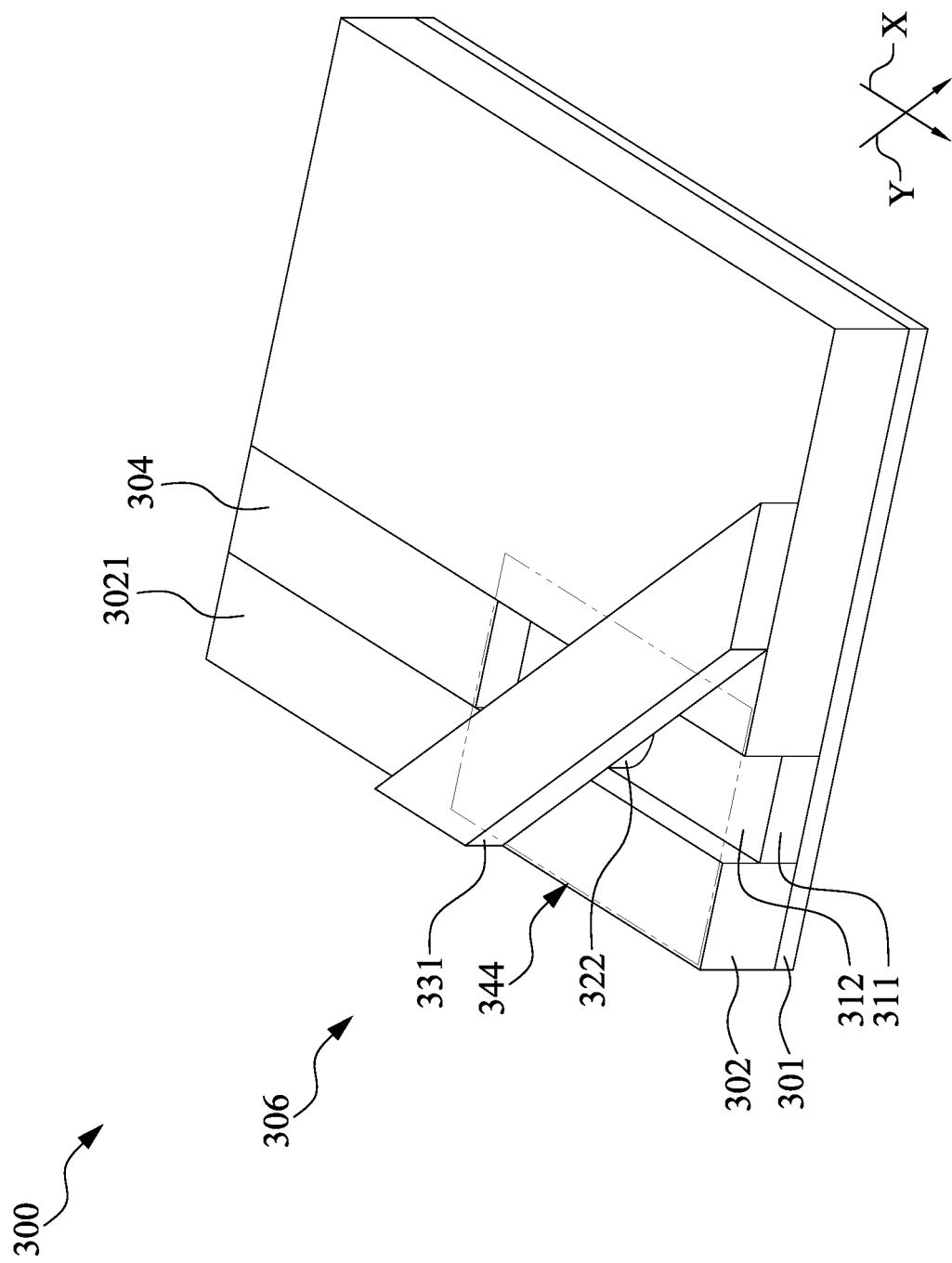

In some embodiments, referring to FIG. 13, the method 200 further includes removing the mask 345, and a top surface 3311 of the second conductive line 331 is exposed. In some embodiments, the conductive via 322, the first conductive line 311 and the second conductive line 331 form an interconnect structure 306 of a semiconductor structure 300. In some embodiments, the conductive via 322, the first conductive line 311 and the second conductive line 331 can be referred to as a dual damascene structure.

Figure 14:
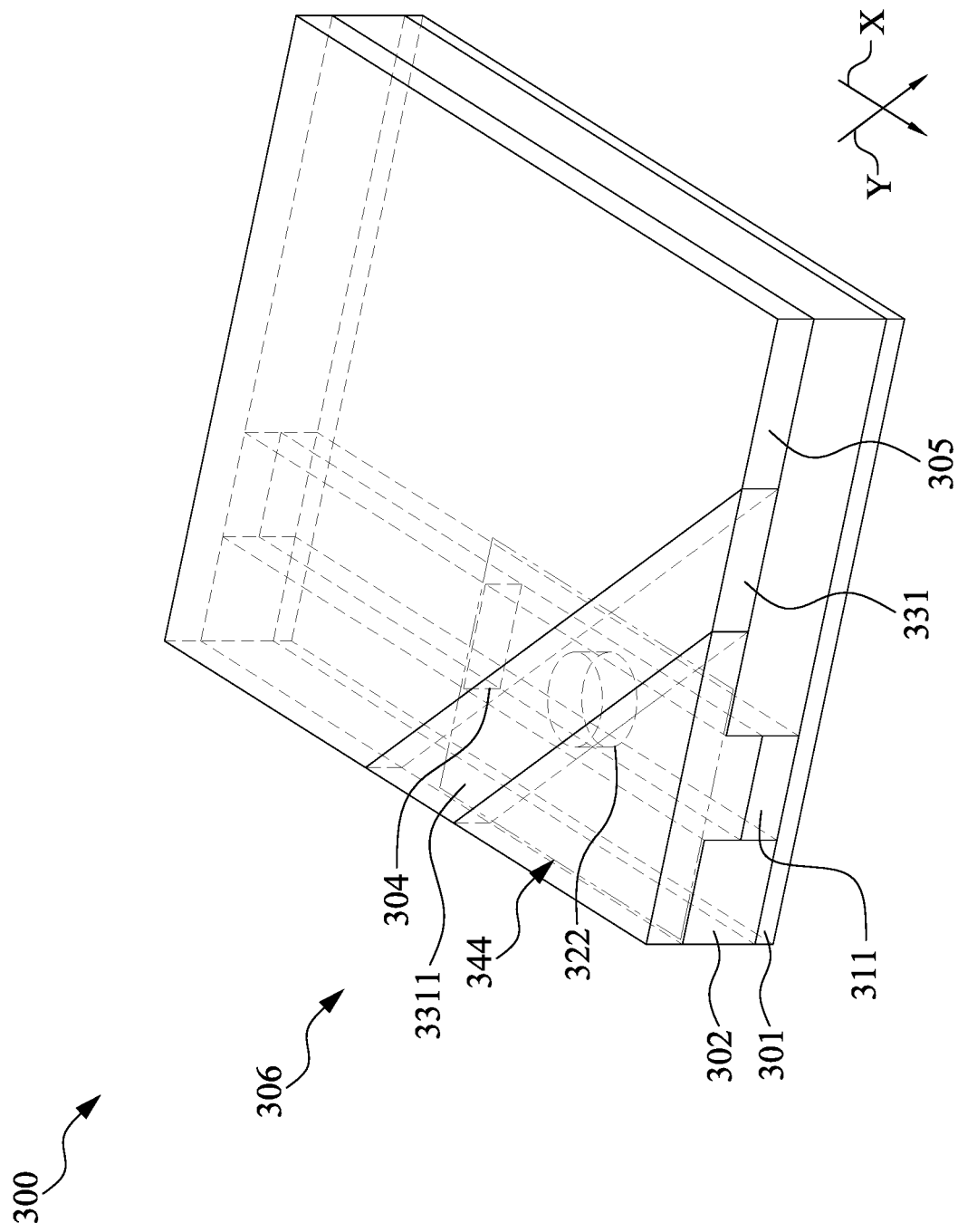

In some embodiments, referring to FIGS. 2 and 14, the method 200 includes step 208, which includes disposing a second dielectric layer 305 to surround the second conductive line 331 and the conductive via 322. In some embodiments, the second dielectric layer 305 is in contact with the exposed portion 312 of the first conductive line 311. In some embodiments, a top surface of the second dielectric layer 305 is coplanar with the top surface 3311 of the second conductive line 331. In some embodiments, the top surface 3311 of the second conductive line 331 is exposed through the second dielectric layer 305. In some embodiments, the second dielectric layer 305 and the dielectric layer 304 are integral. In some embodiments, a material included in the second dielectric layer 305 and a material included in the first dielectric layer 302 are a same material or different materials. In some embodiments, the second dielectric layer 305 is formed by suitable fabrication techniques such as spin coating, chemical vapor deposition (CVD), plasma-enhanced chemical vapor deposition (PECVD), or the like. In some embodiments, the second dielectric layer 305 is a single layer or multiple layers stacked over each other.

Figure 15:
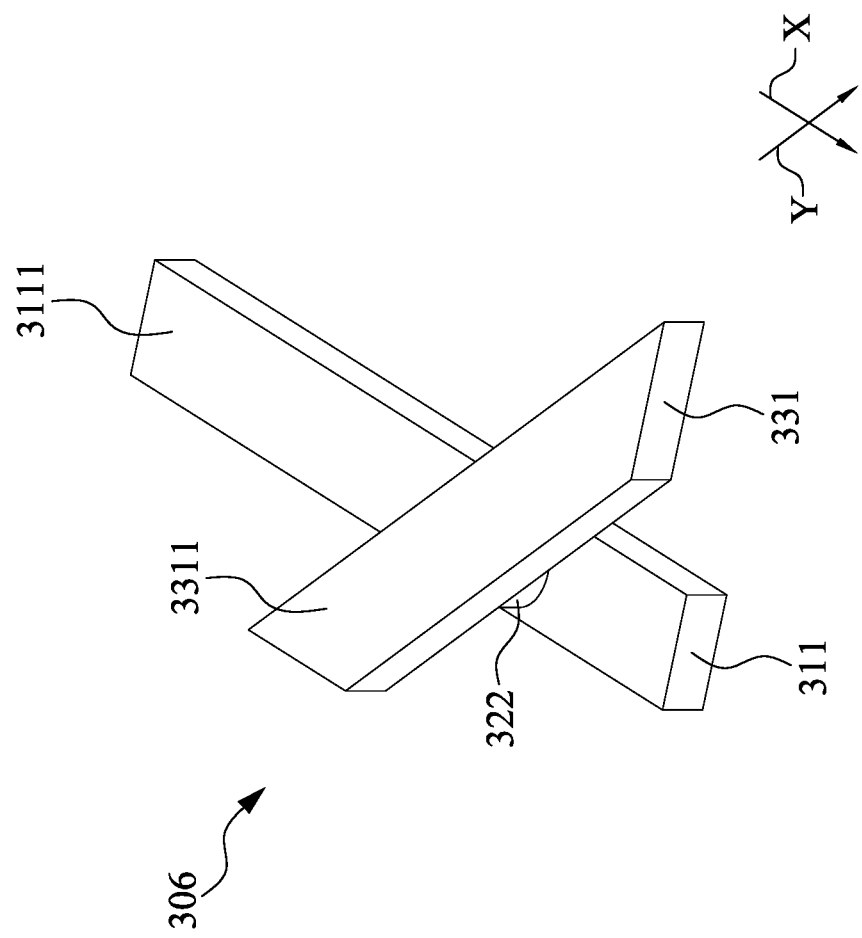
FIG. 15 is a perspective view of a portion of a semiconductor structure in accordance with some embodiments of the present disclosure.
Figure 16:
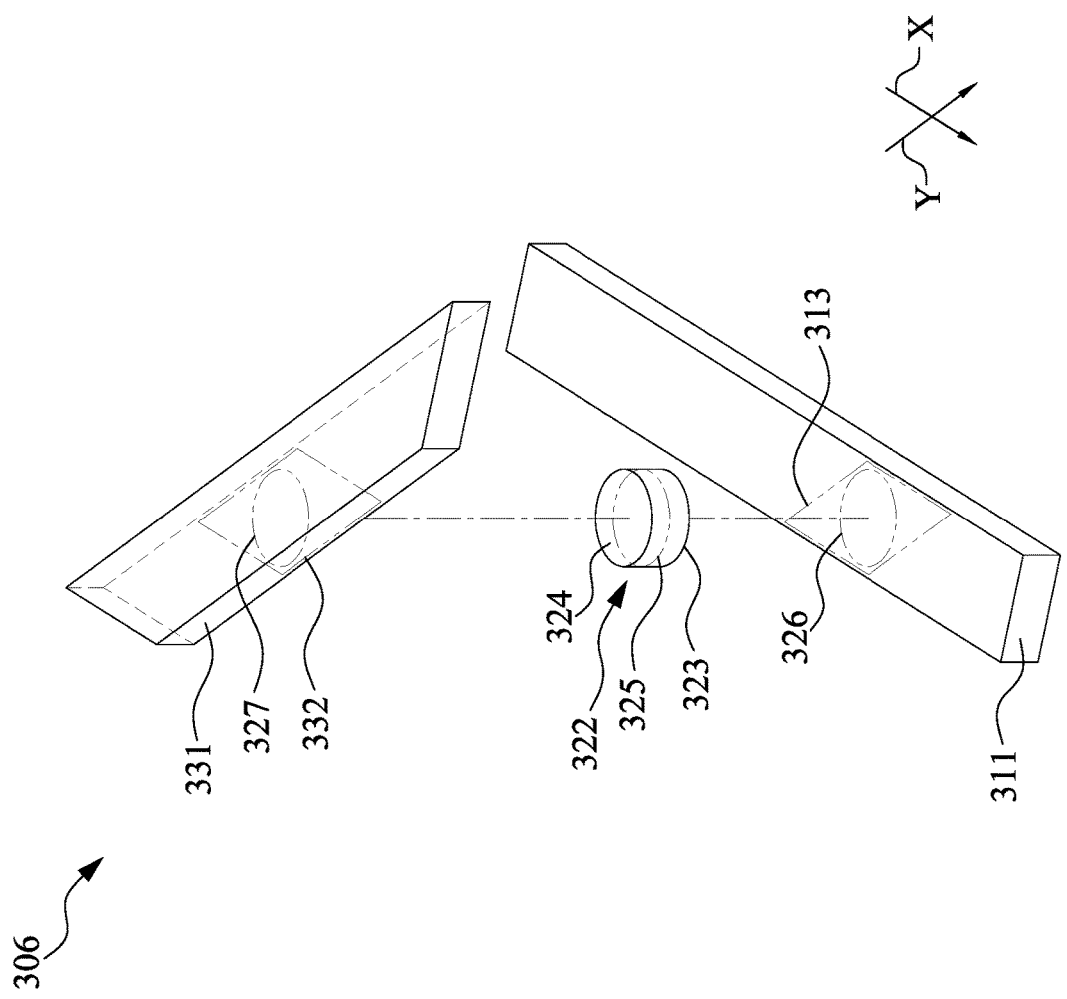
FIG. 16 is an exploded view of a portion of a semiconductor structure in accordance with some embodiments of the present disclosure.

FIG. 15 is a perspective view of an interconnect structure of a semiconductor structure in accordance with some embodiments of the present disclosure. FIG. 16 is an exploded view of an interconnect structure of a semiconductor structure in accordance with some embodiments of the present disclosure. Referring to FIGS. 15 and 16, the interconnect structure 306 of the semiconductor structure 300 includes the first conductive line 311, the second conductive line 331, and the conductive via 322 electrically connecting the first conductive line 311 to the second conductive line 331. The first conductive line 311 extends along the first direction X and has a first surface 313. The second conductive line 331 extends along the second direction Y different from the first direction X, disposed above the first conductive line 311, and has a second surface 332 overlapping the first surface 313 from a top view perspective. The conductive via 322 extends between the first surface 313 and the second surface 332. The conductive via 322 includes a first end 323 disposed within the first surface 313, a second end 324 disposed within second surface 332, and a cross-section 325 disposed between the first end 323 and the second end 324. In some embodiments, at least two of interior angles of the cross-section 325 are substantially unequal to 90°.

In some embodiments, the first surface 313 overlaps and is conformal to the second surface 332 from a top view perspective. A size and a shape of the first surface 313 are same as those of the second surface 332. In some embodiments, the first surface 313 is a quadrilateral. In some embodiments, the first surface 313 is a parallelogram.

In some embodiments, the first surface 313 is in contact with the first end 323, and the second surface 332 is in contact with the second end 324. In some embodiments, the cross-section 325 of the conductive via 322 is a convex polygon, a parallelogram, a trapezoid, an oval, a round shape, or a stadium shape. In some embodiments, the convex polygon includes a triangle, a quadrilateral, a pentagon, a hexagon, a heptagon, or an octagon.

In some embodiments, an area of the first surface 313 of the first conductive layer 311 is greater than an area of the first end 323 of the conductive via 322. In some embodiments, an area of the second surface 332 of the second conductive layer 331 is greater than an area of the second end 324 of the conductive via 322. In some embodiments, the cross-section 325 of the conductive via 322 is inwardly offset from the first surface 313 and/or the second surface 332 from a top view perspective.

In some embodiments, an area of a first interface 326 between the first end 323 and the first conductive line 311 is substantially equal to an area of the cross-section 325. In some embodiments, the cross-section 325 overlaps the first interface 326 from a top view perspective. In some embodiments, the area of the first interface 326 is smaller than the area of the cross-section 325. In some embodiments, the area of the first interface 326 is less than an area of the first surface 313. In some embodiments, the first interface 326 is positioned within the first surface 313 from a top view perspective. In some embodiments, the first interface 326 is a convex polygon, a parallelogram, a trapezoid, an oval, a round shape, or a stadium shape. In some embodiments, the convex polygon includes a triangle, a quadrilateral, a pentagon, a hexagon, a heptagon, or an octagon.

In some embodiments, an area of a second interface 327 between the second end 324 and the second conductive line 331 is substantially equal to the area of the cross-section 325 from a top view perspective. In some embodiments, the cross-section 325 is overlapped by the second interface 327 from a top view perspective. In some embodiments, the area of the second interface 327 is less than the area of the cross-section 325. In some embodiments, the area of the second interface 327 is less than the area of the second surface 332. In some embodiments, the second interface 327 is positioned within the second surface 332 from a top view perspective. In some embodiments, the area of the cross-section 325 is greater than the area of the second interface 327. In some embodiments, the second interface 327 is a convex polygon, a parallelogram, a trapezoid, an oval, a round shape, or a stadium shape. In some embodiments, the convex polygon includes a triangle, a quadrilateral, a pentagon, a hexagon, a heptagon, or an octagon.

Figure 17:
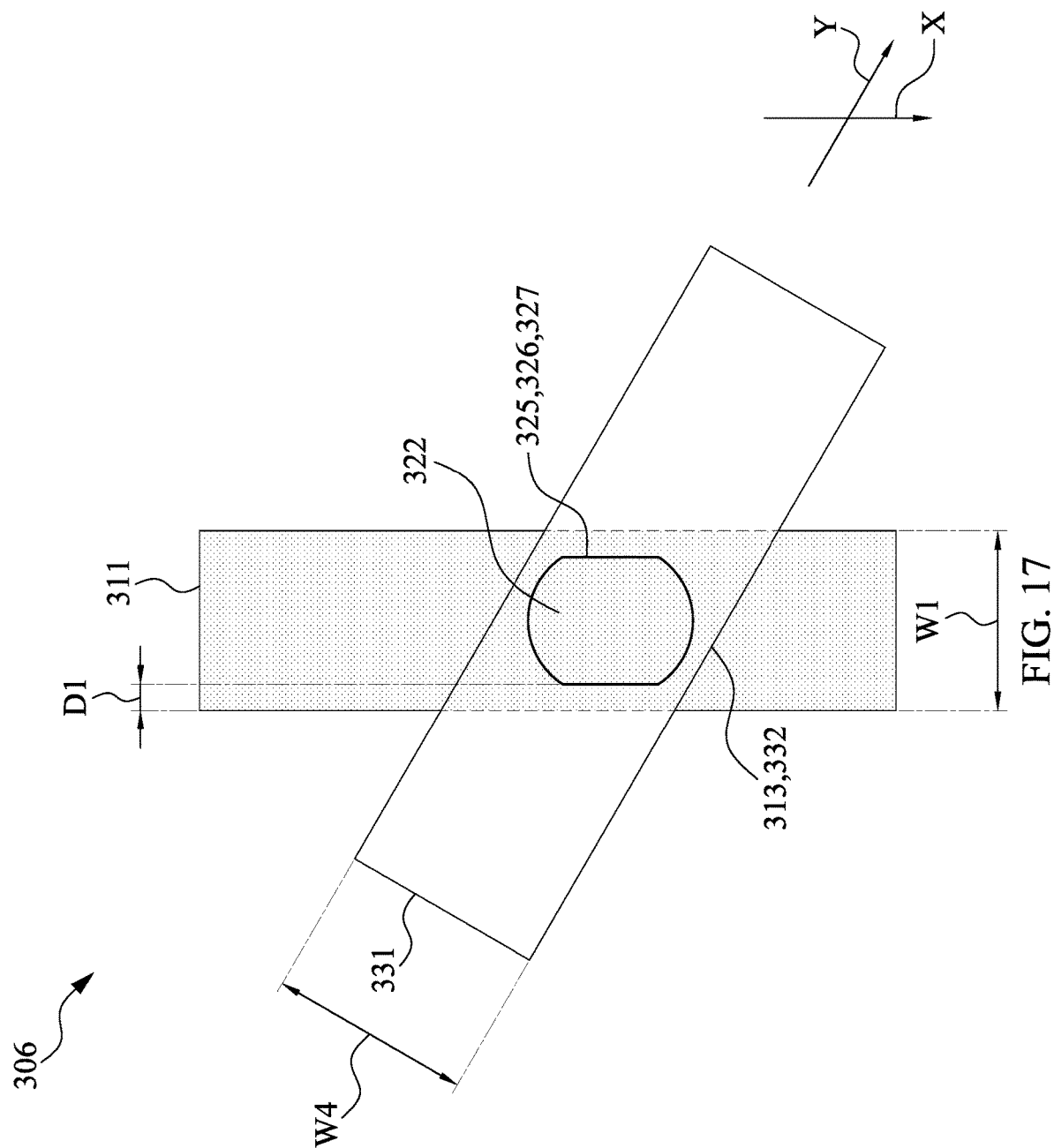
FIGS. 17 to 23 are top views of a portion of a semiconductor structure in accordance with some embodiments of the present disclosure.

FIGS. 17 to 23 are top views of an interconnect structure of a semiconductor structure in accordance with some embodiments of the present disclosure. Referring to FIG. 17, in some embodiments, a cross-section 325 of a conductive via 322 is positioned to overlap an area within a first surface 313 or a second surface 332 from a top view perspective by a predetermined inset distance D1. In some embodiments, the predetermined inset distance D1 is greater than 0 and less than a quarter of the width W1 of the first conductive line 311. In some embodiments, the predetermined inset distance D1 is greater than 0 and less than a quarter of a width W4 of the second conductive line 331. In some embodiments, the cross-section 325 of the conductive via 322 is a stadium shape.

Figure 18:
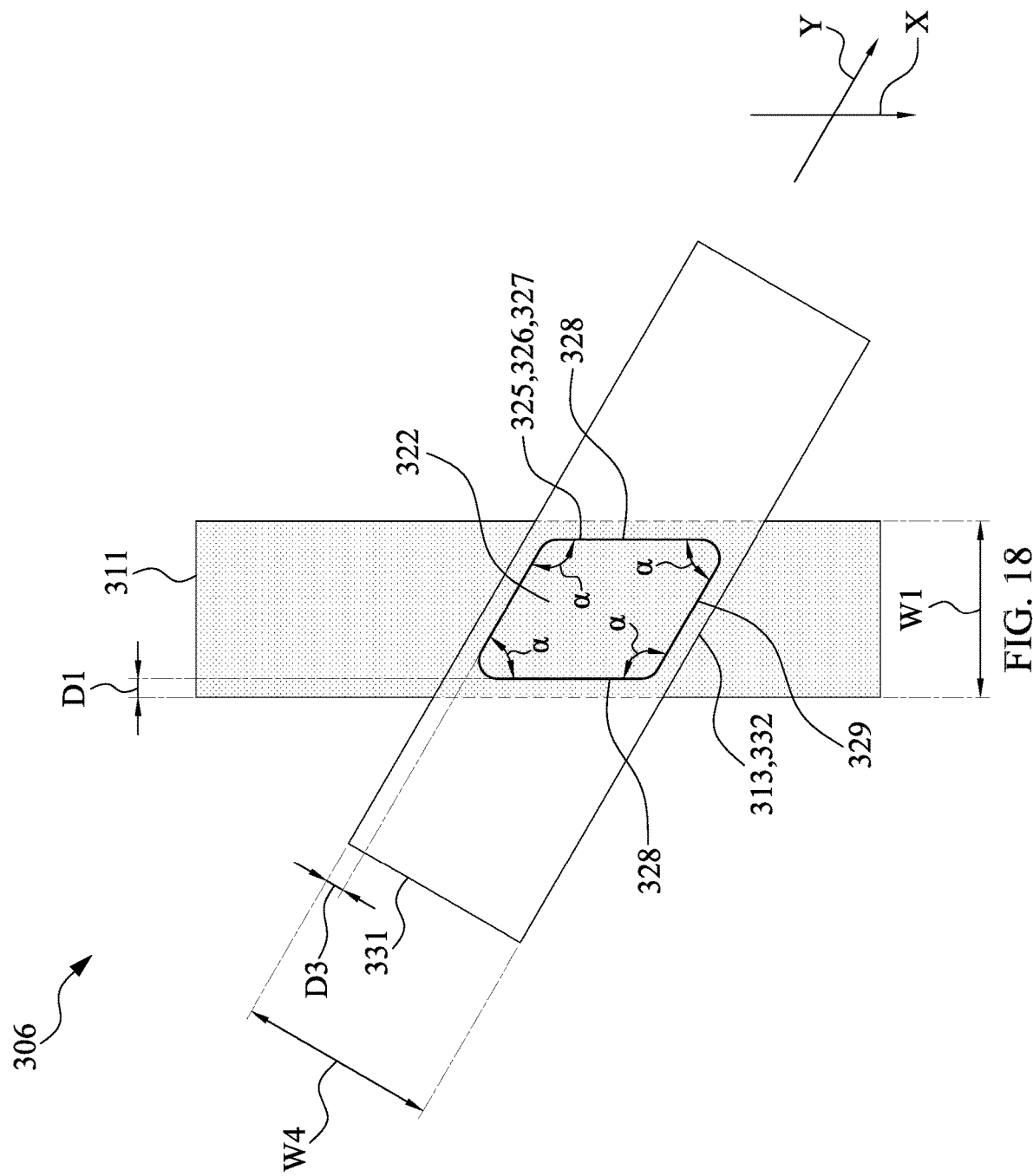

Referring to FIG. 18, in some embodiments, the cross-section 325 of the conductive via 322 includes a first pair of sides 328 extending along a first direction X and a second pair of sides 329 extending along a second direction Y. In some embodiments, a shortest distance D2 between the first pair of sides 328 and edges of the first surface 313 is predetermined. In some embodiments, a shortest distance D3 between the second pair of sides 329 and edges of the second surface 332 is predetermined. In some embodiments, the cross-section 325 of the conductive via 322 includes a fillet or a chamfer adjacent to a corner of the cross-section 325. In some embodiments, the distance D2 is greater than 0 and less than a quarter of the width W1 of the first conductive line 311. In some embodiments, the distance D3 is greater than 0 and less than a quarter of the width W4 of the second conductive line 331. The distance D2 may be same as or different from the distance D3. In some embodiments, at least two of interior angles α of the cross-section 325 are substantially unequal to 90°. In some embodiments, all of interior angles α of the cross-section 325 are substantially unequal to 90°.

Figure 19:
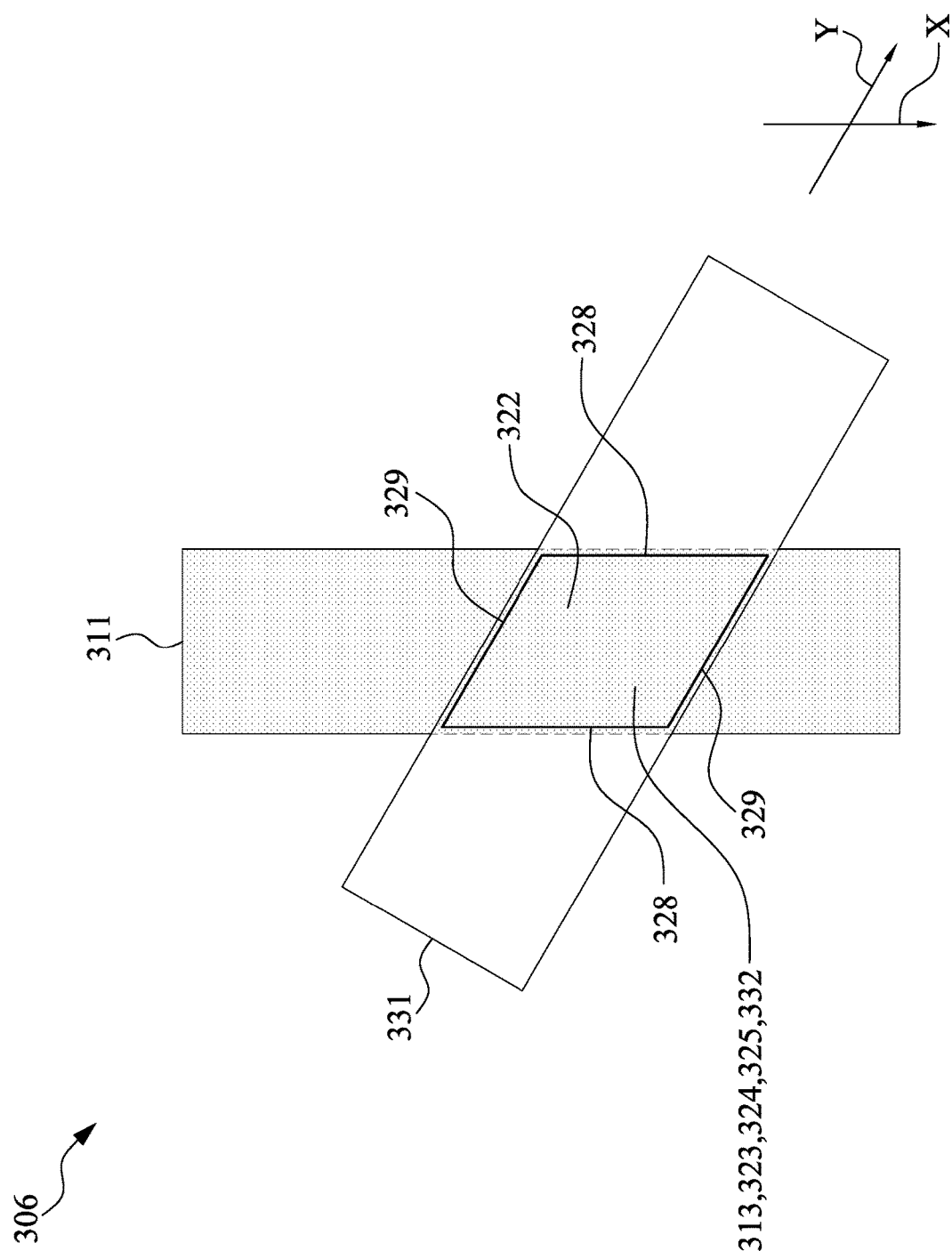

Referring to FIG. 19, in some embodiments, the cross-section 325 of the conductive via 322 is substantially aligned with the first surface 313 or the second surface 332 from a top view perspective. In some embodiments, a size and a shape of the cross-section 325 of the conductive via 322 are same as a size and a shape of the first surface 313. In some embodiments, the size and the shape of the cross-section 325 of the conductive via 322 are same as a size and a shape of the second surface 332. In some embodiments, the cross-section 325 of the conductive via 322 includes the first pair of sides 328 extending along the first direction X and aligned with edges of a first conductive line 311. In some embodiments, the cross-section 325 of the conductive via 322 includes the second pair of sides 329 extending along the second direction Y and aligned with edges of a second conductive line 331. In some embodiments, the distance D2 is equal to 0. In some embodiments, the distance D3 is equal to 0.

Figure 20:
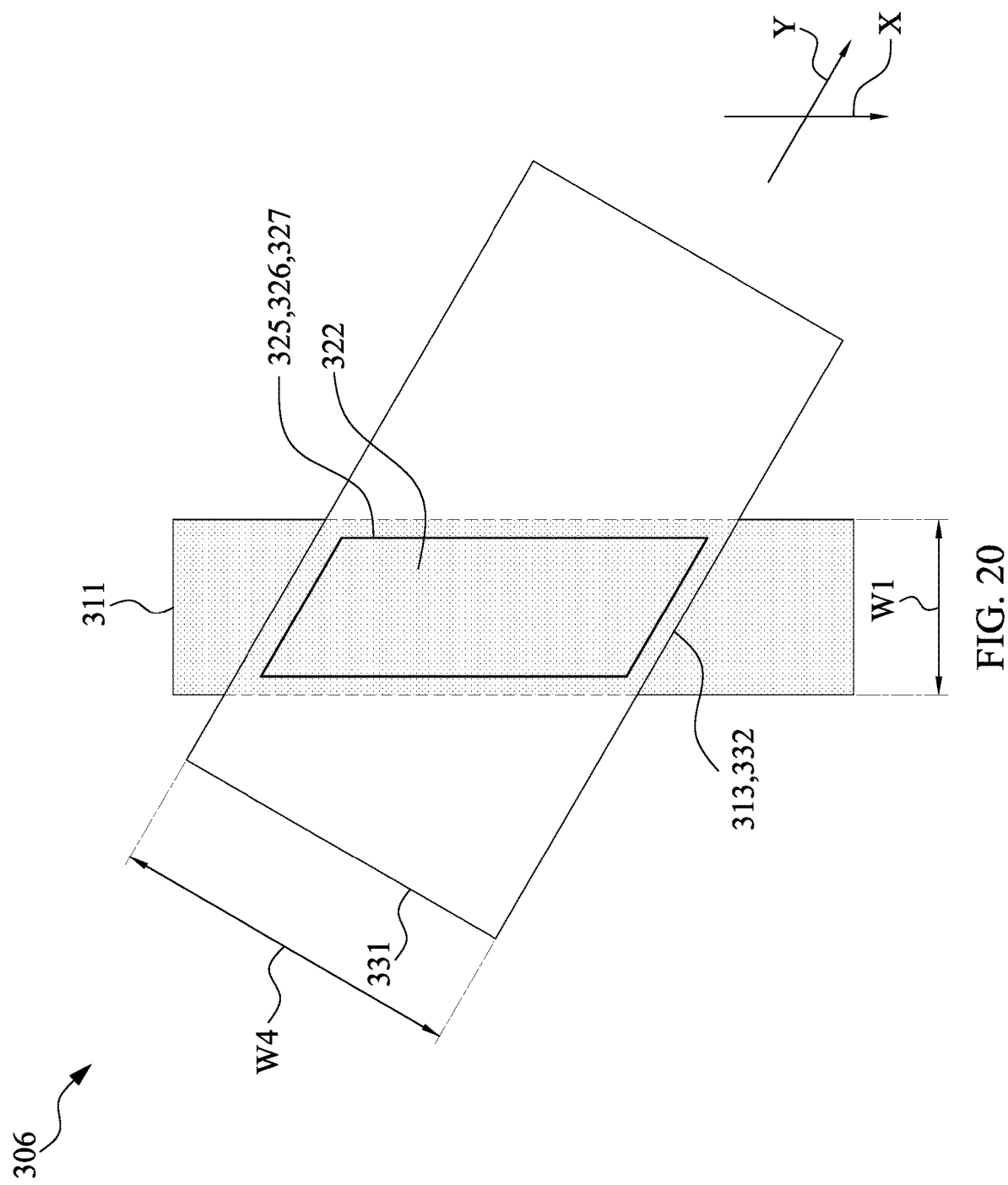

Referring to FIG. 20, in some embodiments, a width W1 of the first conductive line 311 is different from a width W4 of the second conductive line 331. In some embodiments, a plurality of conductive vias 322 are disposed between the first conductive line 311 and the second conductive line 331.

Figure 21:
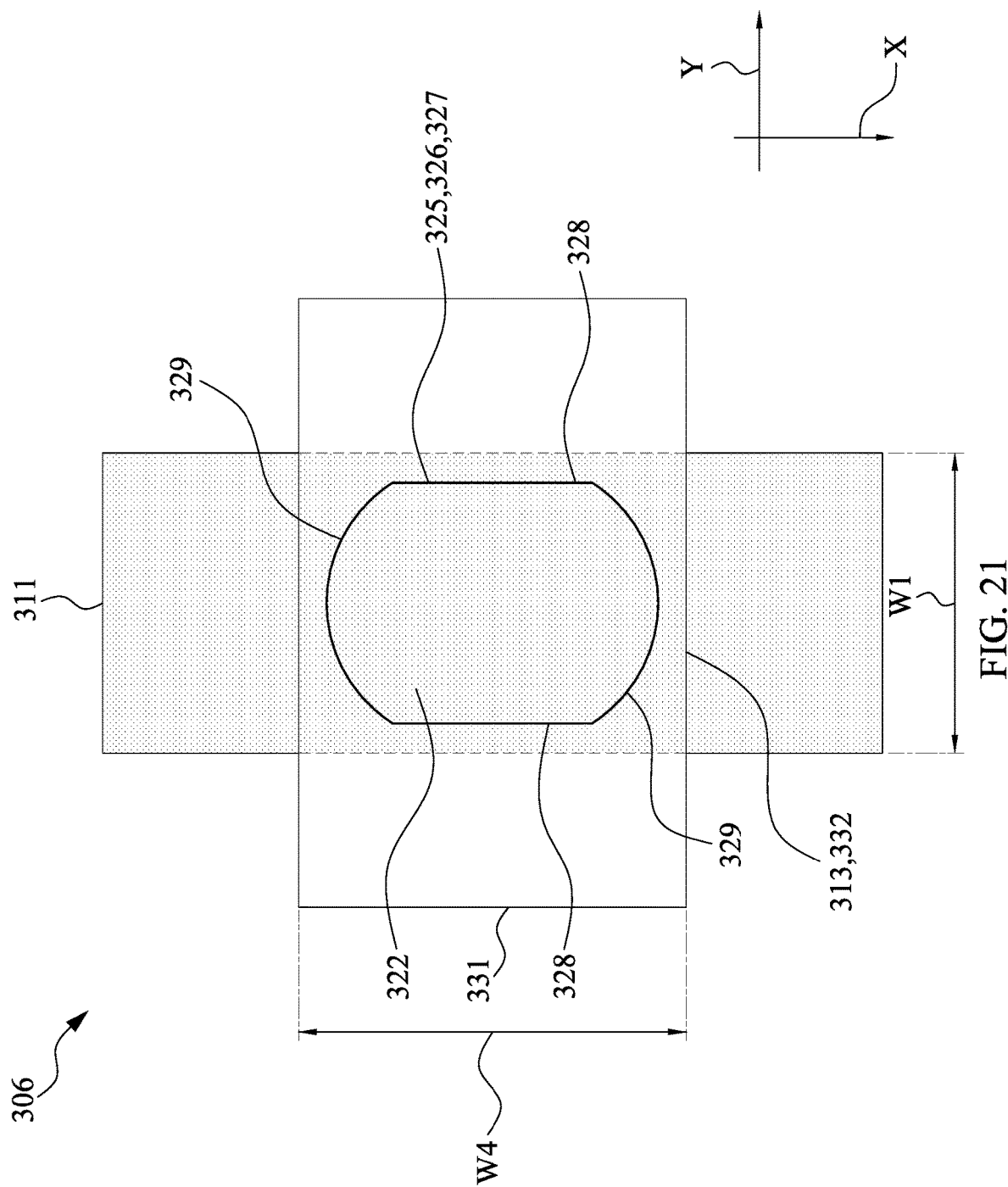

Referring to FIG. 21, in some embodiments, the first direction X is orthogonal to the second direction Y. In some embodiments, the cross-section 325 of the conductive via 322 is a stadium shape.

Figure 22:
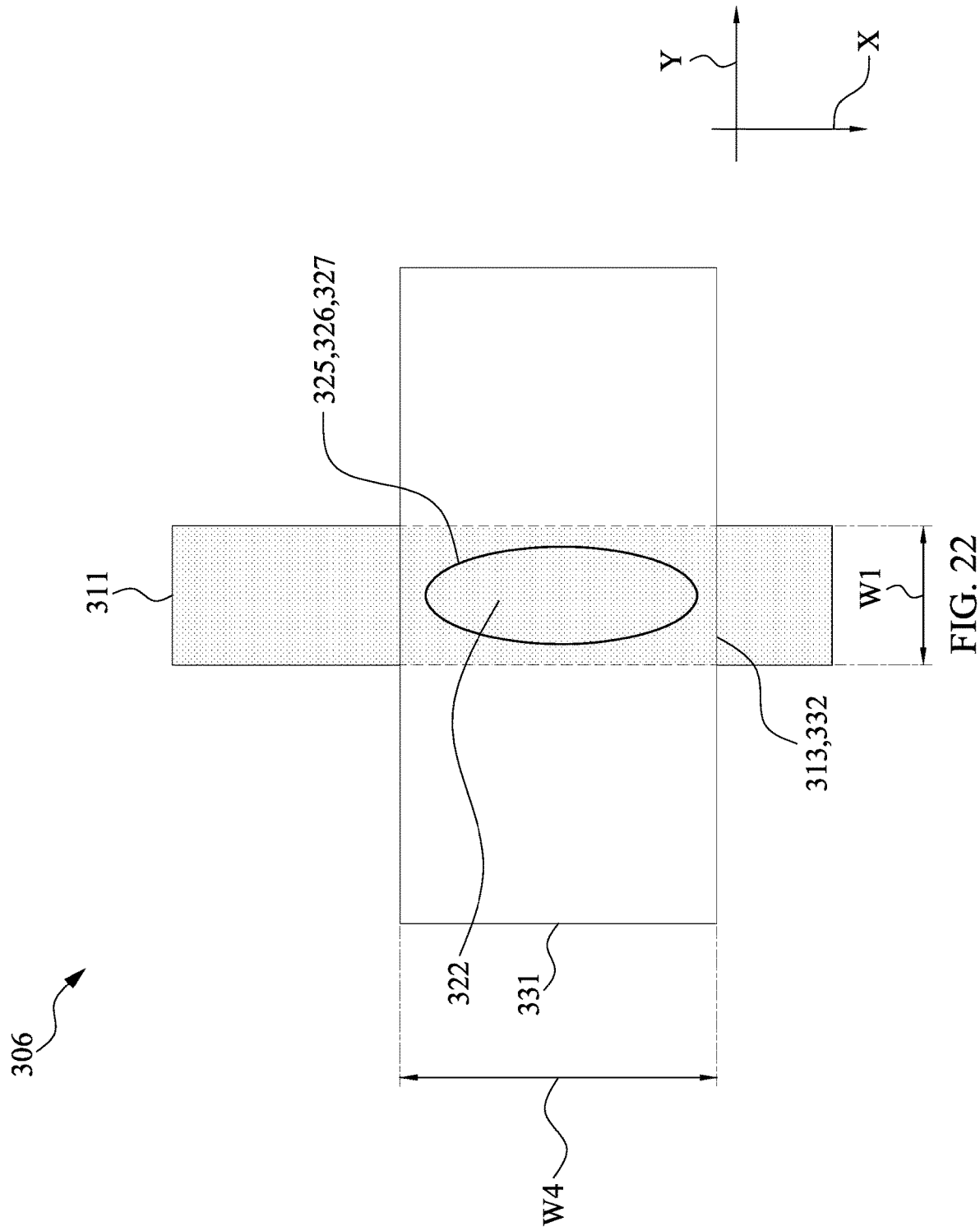

Referring to FIG. 22, in some embodiments, the cross-section 325 of the conductive via 322 is an oval. In some embodiments, when the width W1 of the first conductive line 311 is different from the width W4 of the second conductive line 331, the cross-section 325 may be an oval.

Figure 23:
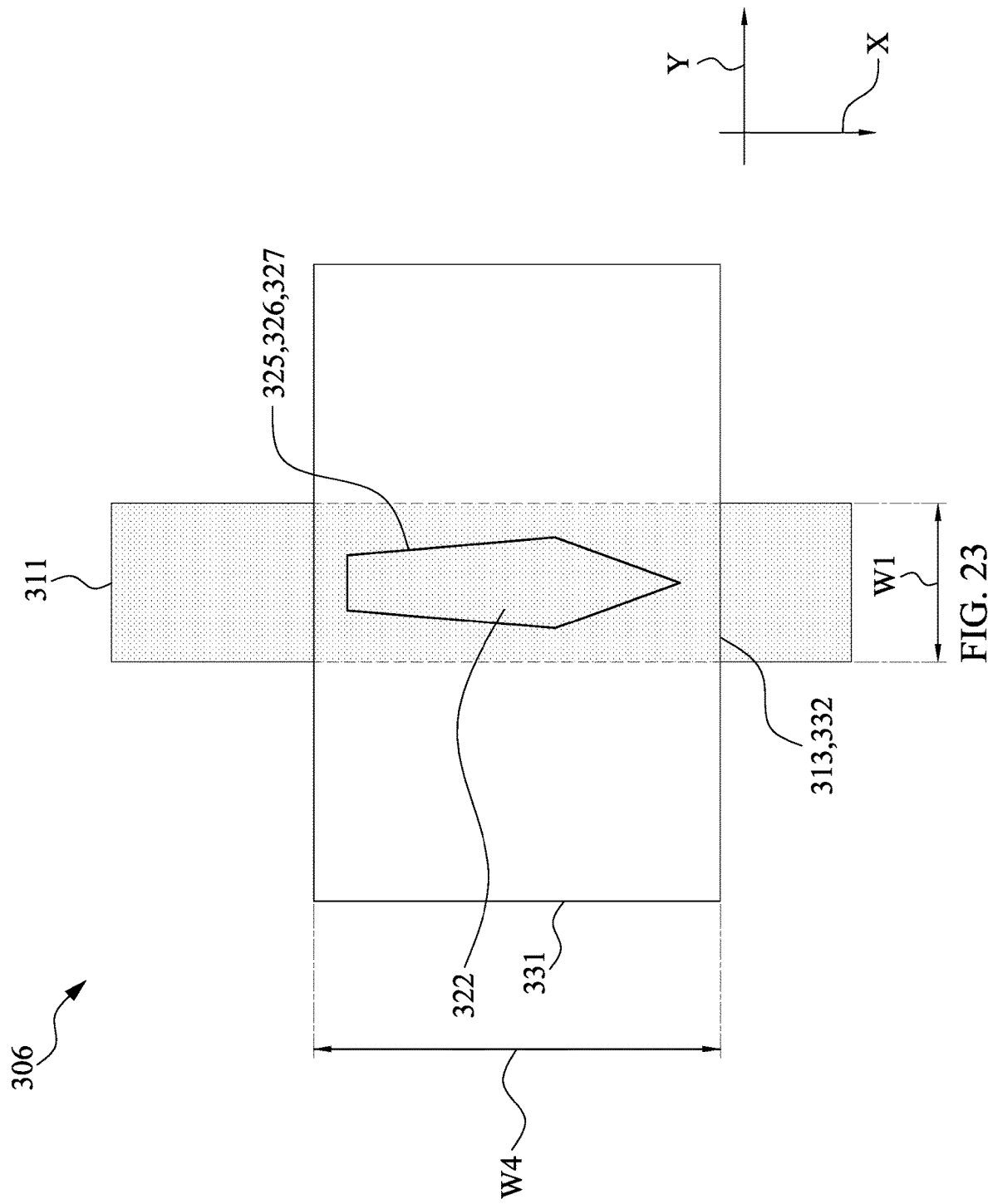

Referring to FIG. 23, in some embodiments, the cross-section 325 of the conductive via 322 is a pentagon. In some embodiments, the cross-section 325 of the conductive via 322 is a regular pentagon.

Figure 24:
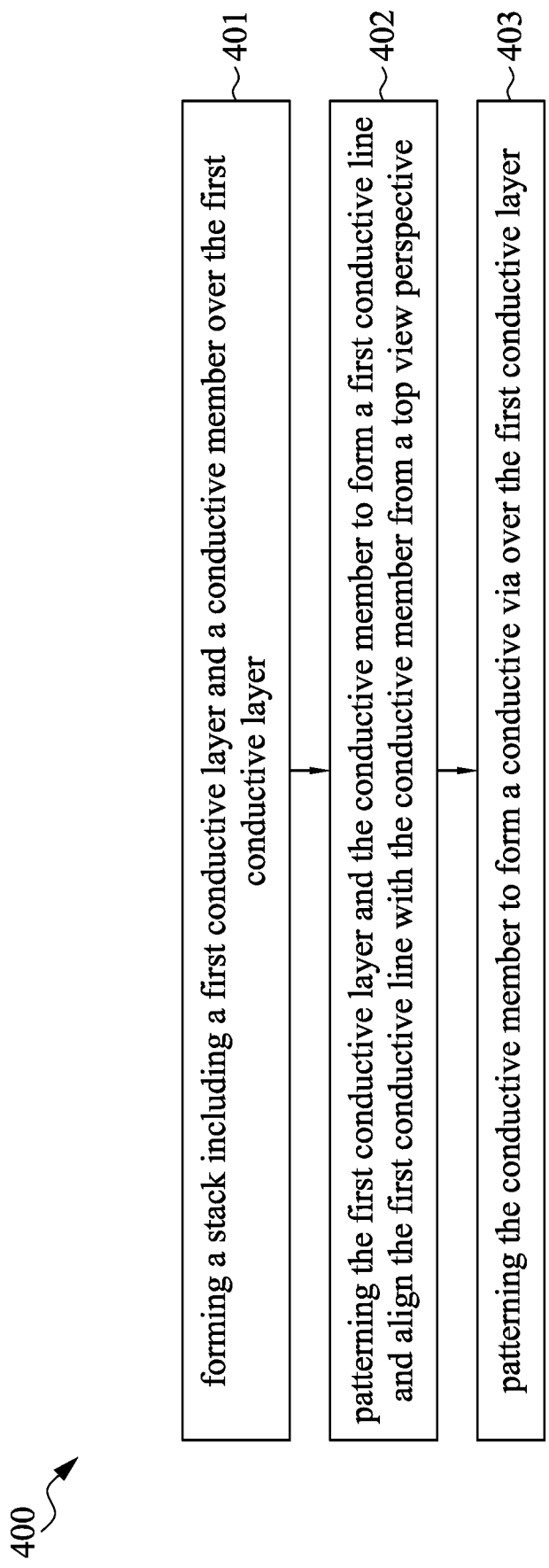
FIG. 24 illustrates a flowchart of a method, in accordance with some embodiments of the present disclosure.

FIG. 24 illustrates a flowchart of a method 400 of manufacturing a semiconductor structure, in accordance with some embodiments. In some embodiments, as shown in FIG. 21, the method 400 includes the following steps. Step 401 includes forming a stack including a first conductive layer and a conductive member over the first conductive layer. Step 402 includes patterning the first conductive layer and the conductive member to form a first conductive line and align the first conductive line with the conductive member from a top view perspective. Step 403 includes patterning the conductive member to form a conductive via over the first conductive layer.

Figure 25:
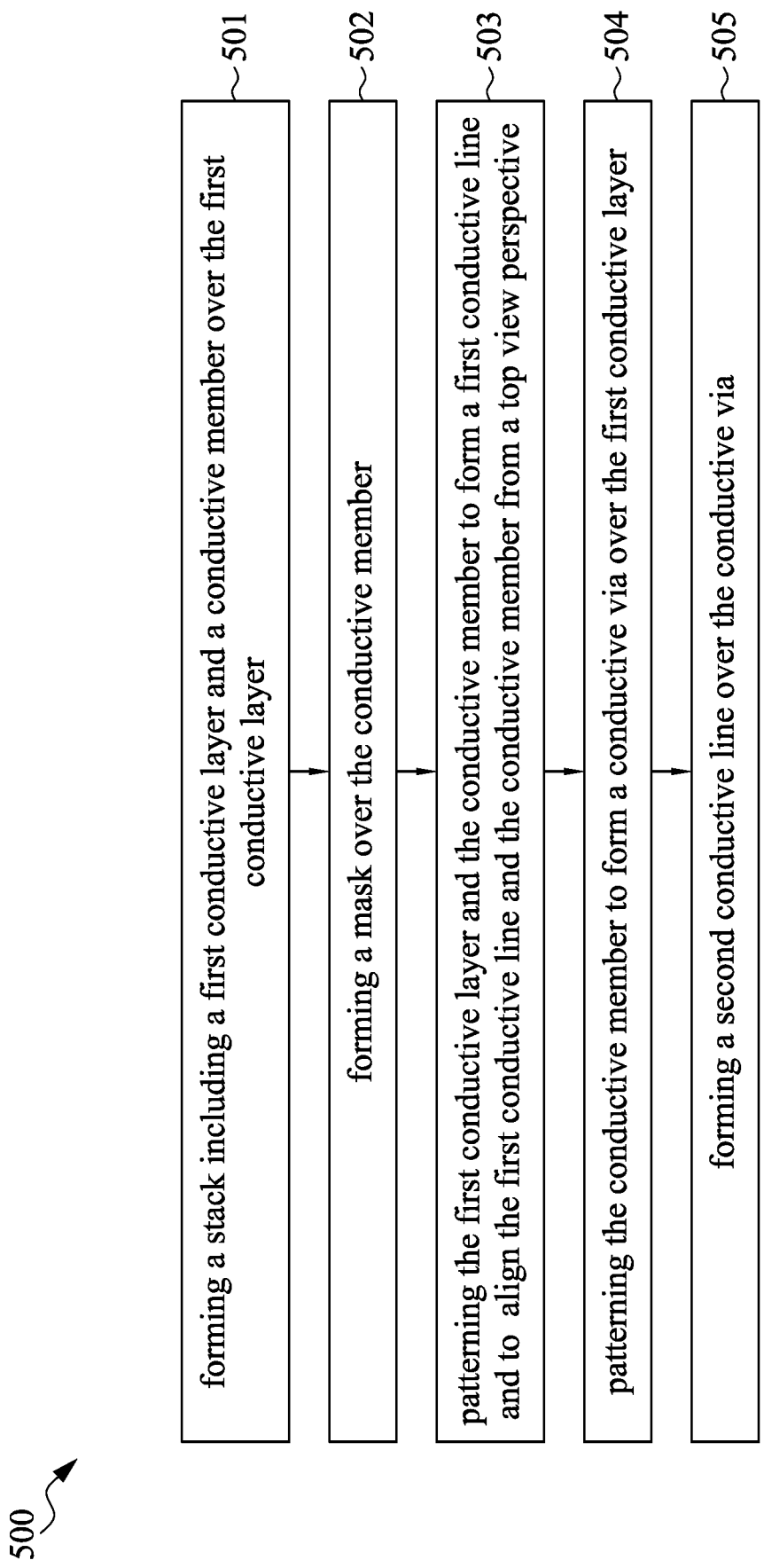
FIG. 25 illustrates a flowchart of a method, in accordance with some embodiments of the present disclosure.

FIG. 25 illustrates a flowchart of a method 500 of manufacturing a semiconductor structure, in accordance with some embodiments. Additional steps can be provided before, during, and after the steps shown in FIGS. 24 and 25, and some of the steps described below can be replaced or eliminated in other embodiments of the method 400 and the method 500. The order of the steps may be interchangeable. FIGS. 26 to 34 are schematic views illustrating exemplary operations for the method of manufacturing a semiconductor structure, such as the operations illustrated in FIGS. 24 and 25, according to one embodiment of the present disclosure.

Figure 34:
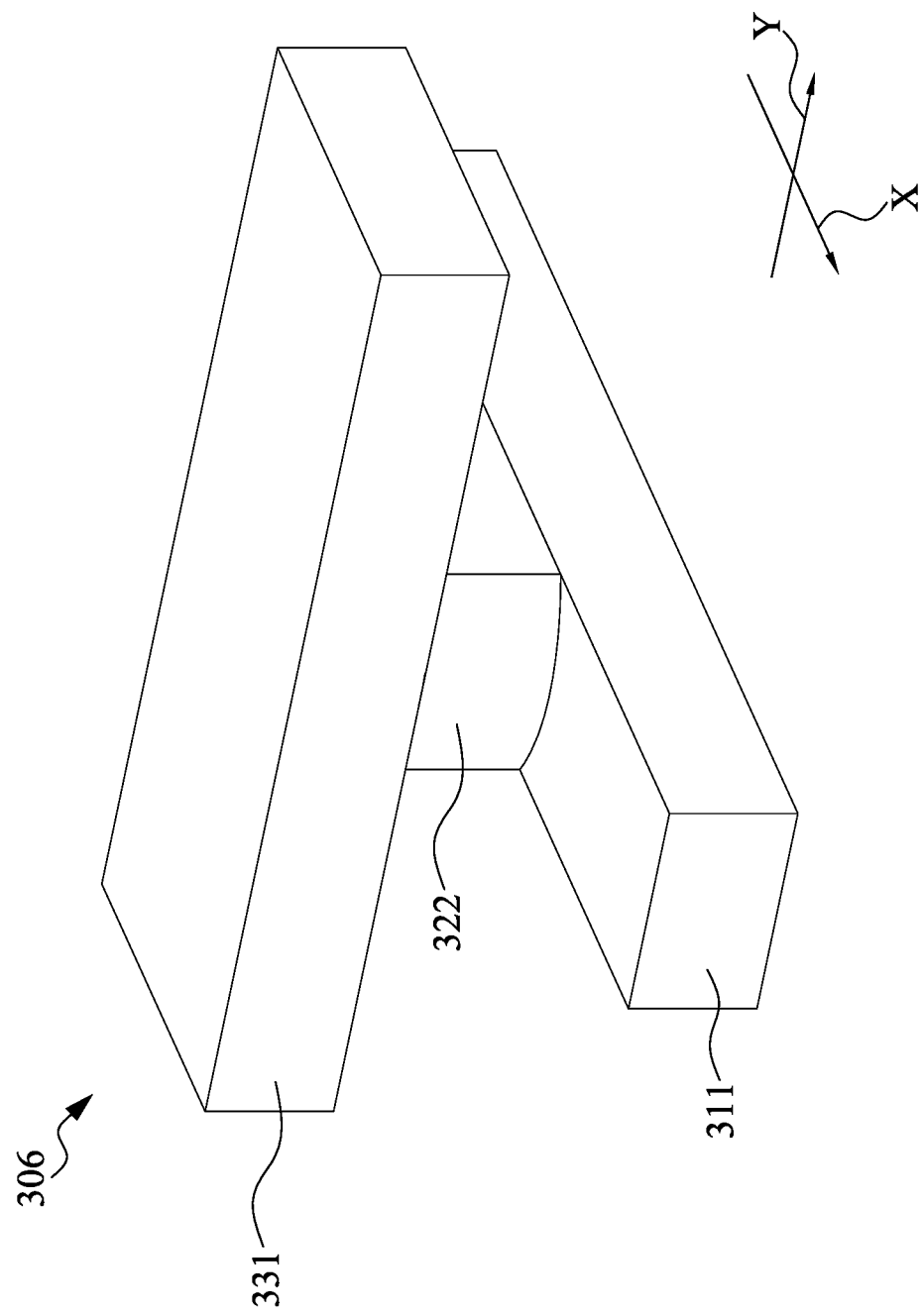

In some embodiments, the methods 400 and 500 are configured to form the interconnect structure 306 as illustrated in FIGS. 15 and 34.

Figure 26:
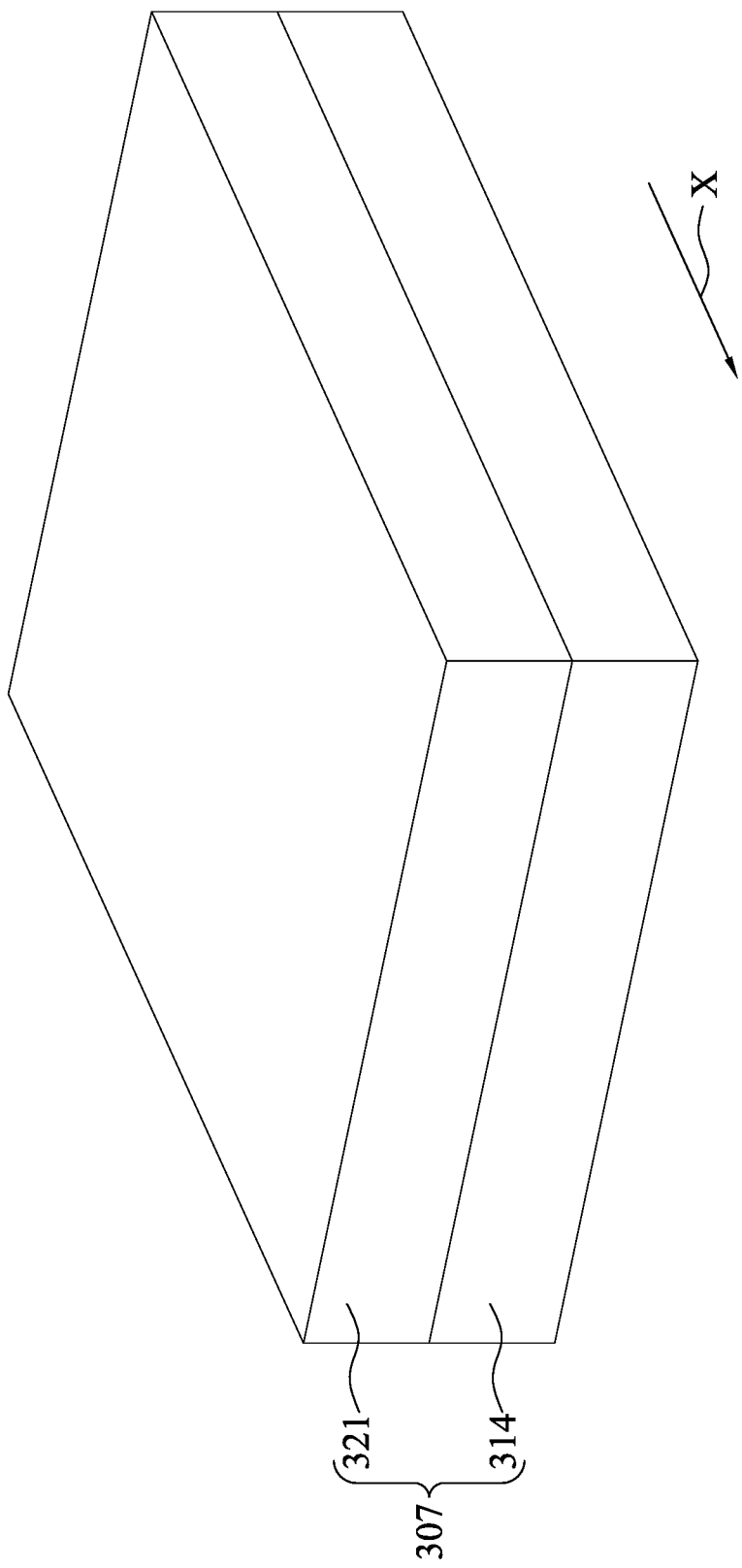
FIGS. 26 to 34 are perspective views illustrating exemplary operations in a method of manufacturing a semiconductor structure, in accordance with some embodiments of the present disclosure.

Referring to FIGS. 25 and 26, in some embodiments, the method 500 includes step 501, which includes forming a stack 307 including a first conductive layer 314 and a conductive member 321 over the first conductive layer 314. The respective process is illustrated as step 401 in the method 400 as shown in FIG. 24.

Figure 27:
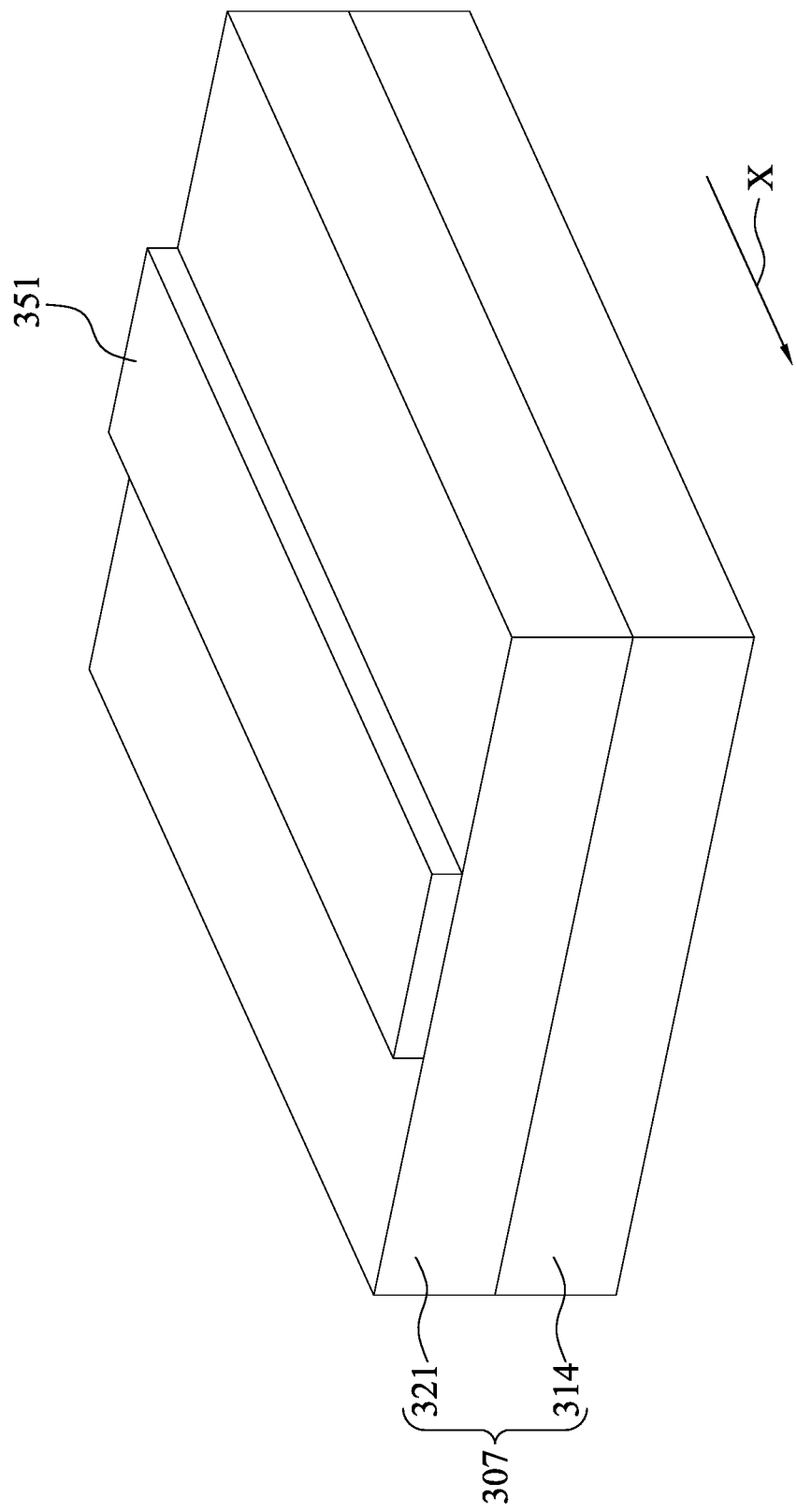

In some embodiments, the method 500 includes step 502, which includes forming a mask 351 over the conductive member 321. Referring to FIGS. 25 and 27, the mask 351 is formed over the stack 307. In some embodiments, the mask 351 is a hard mask. In some embodiments, the mask 351 is a strip extending along the first direction X from a top view perspective. The mask 351 may be formed by CVD, PVD, atomic layer deposition (ALD), or the like.

Figure 28:
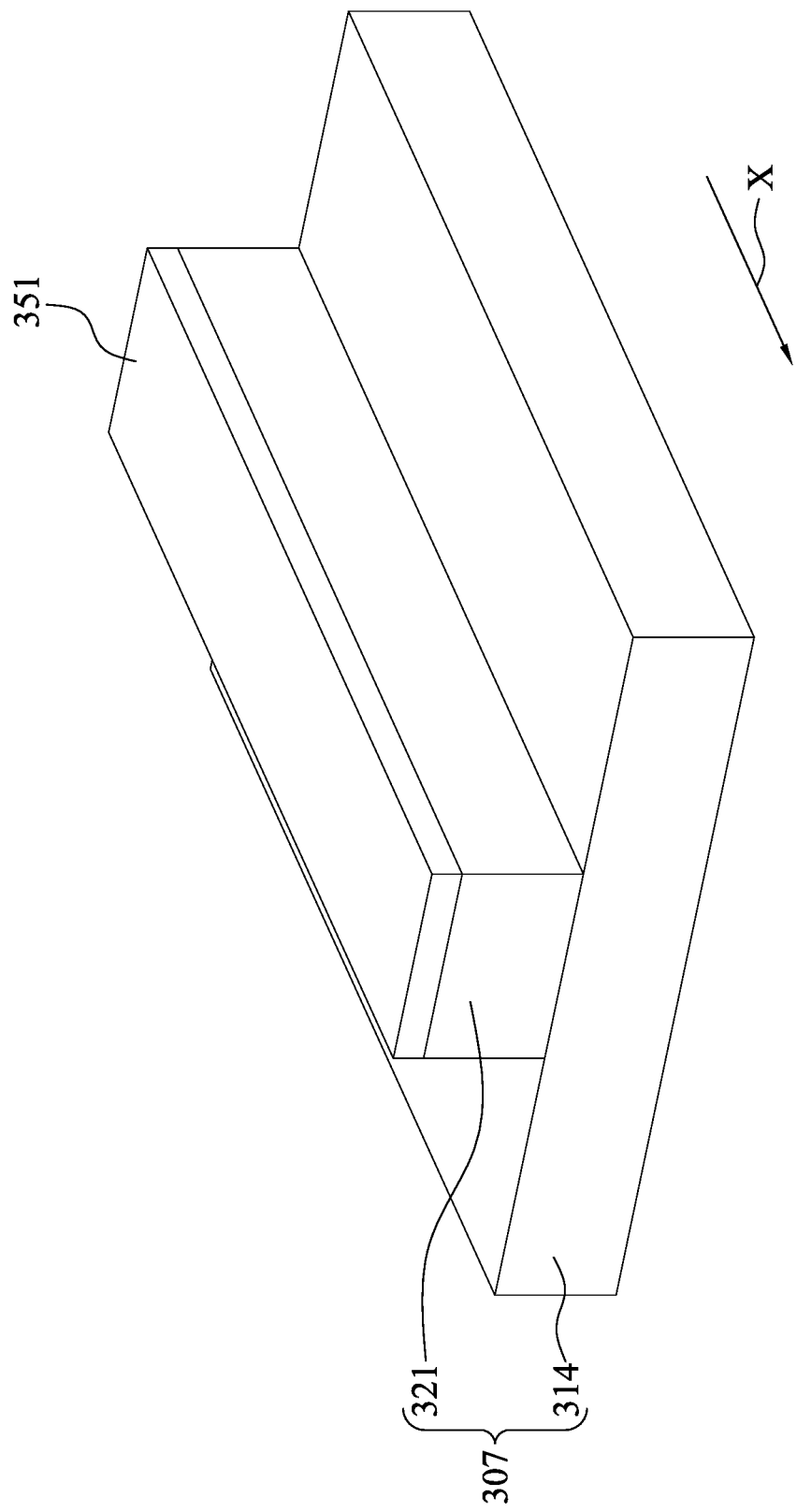

In some embodiments, the method 500 includes step 503, which includes patterning the first conductive layer 314 and the conductive member 321 to form a first conductive line 311 and to align the first conductive line 311 with the conductive member 321 from a top view perspective. The respective process is illustrated as step 402 in the method 400 as shown in FIG. 24. In some embodiments, the pattern of the mask 351 is transferred to the conductive member 321 and the first conductive layer 314 sequentially. Referring to FIGS. 25 and 28, a portion of the conductive member 321 is removed, and a remaining conductive member 321 is aligned with the mask 351 from a top view perspective. In some embodiments, the remaining conductive member 321 is a strip extending along a first direction X from a top view perspective. In some embodiments, a portion of the first conductive layer 314 is exposed through the remaining conductive member 321.

Figure 29:
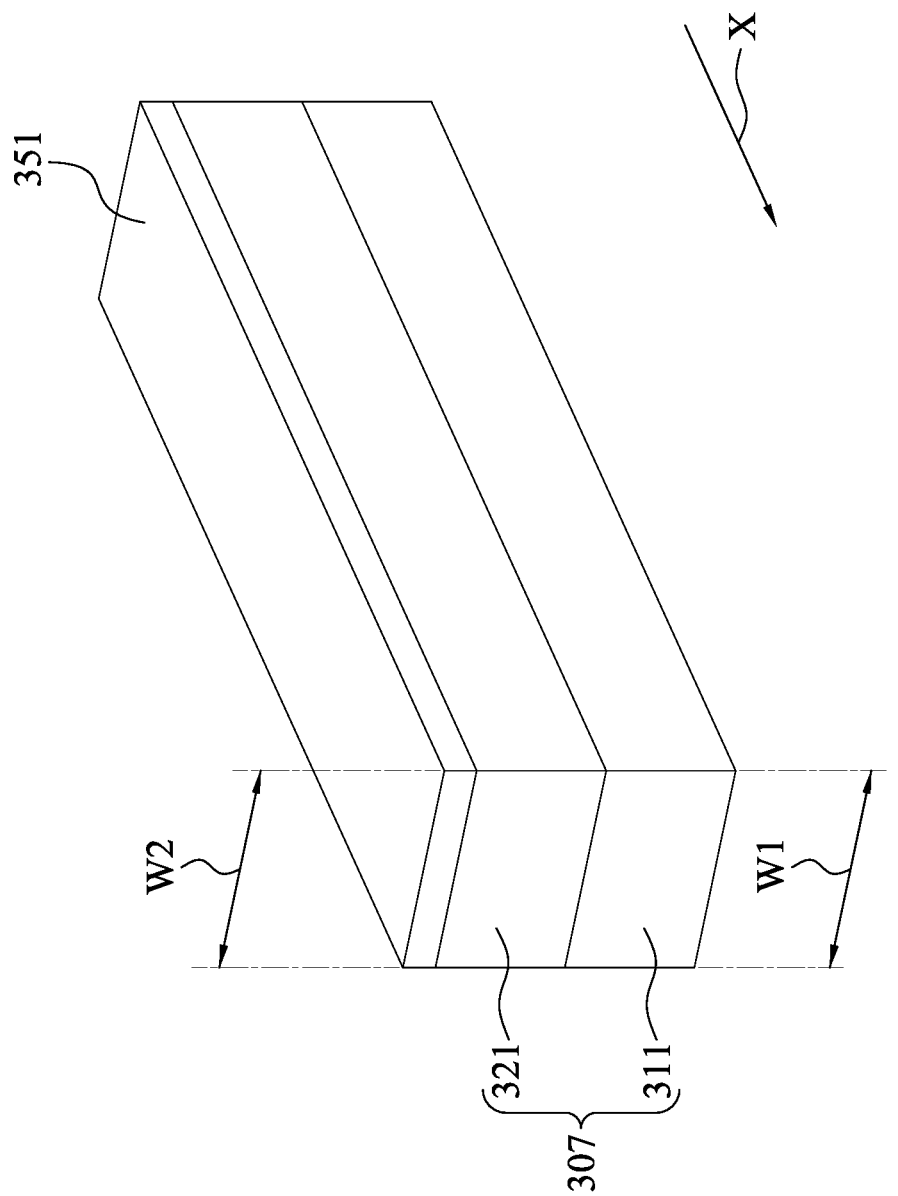

Referring to FIGS. 25 and 29, a portion of the first conductive layer 314 is removed, and the first conductive line 311 is formed. In some embodiments, the thus formed first conductive line 311 is disposed under the remaining conductive member 321. The mask 351, the remaining conductive member 321 and the first conductive line 311 are stacked and aligned with each other from a top view perspective. In some embodiments, the stack 307 includes the first conductive line 311 and the conductive member 321. In some embodiments, the stack 307 extends along the first direction X.

In some embodiments, a width W1 of the first conductive line 311 equals a width W2 of the conductive member 321. In some embodiments, the first conductive layer 314 and the conductive member 321 are patterned simultaneously.

Figure 30:
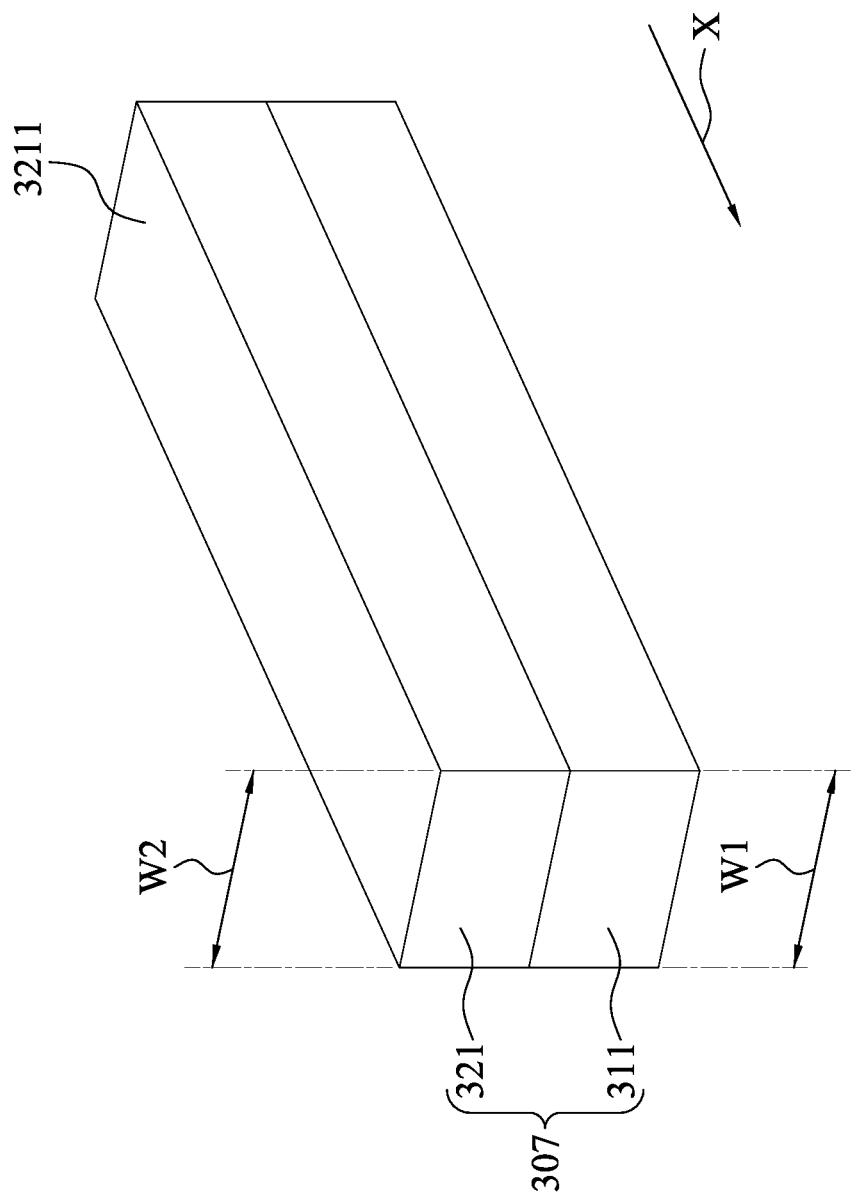

In some embodiments, referring to FIG. 30, the mask 351 is removed. In some embodiments, a top surface 3211 of the conductive member 321 is exposed.

Figure 31:
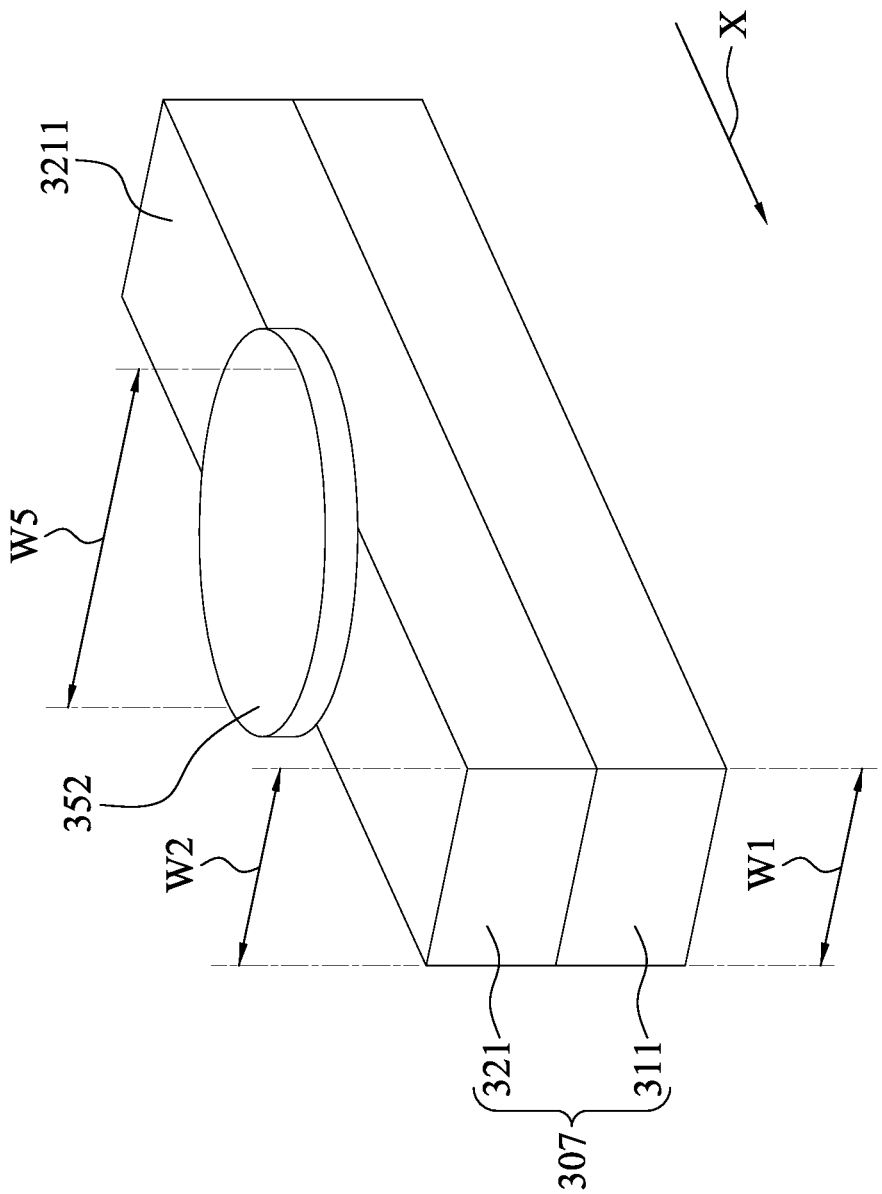

In some embodiments, the method 500 includes step 504, which includes patterning the conductive member 321 to form a conductive via 322 over the first conductive layer 311. The respective process is illustrated as step 403 in the method 400 as shown in FIG. 24. Referring to FIGS. 25 and 31, in some embodiments, a mask 352 is disposed over the top surface 3211 of the conductive member 321. In some embodiments, the mask 352 is a hard mask. The mask 352 may be formed by CVD, PVD, atomic layer deposition (ALD), or the like.

The mask 352 covers a portion of the conductive member 321. In some embodiments, a position, a shape and a size of the mask 352 are determined according to a predetermined position, a predetermined shape and a predetermined size of the subsequently-formed conductive via 322. In some embodiments, a width W5 of the mask 352 is greater than or equal to the width W2 of the conductive member 321. In some embodiments, the width W5 of the mask 352 is greater than or equal to the width W1 of the first conductive line 311. In some embodiments, a dielectric layer (not shown) surrounds the first conductive line 311 and the conductive member 321.

Figure 32:
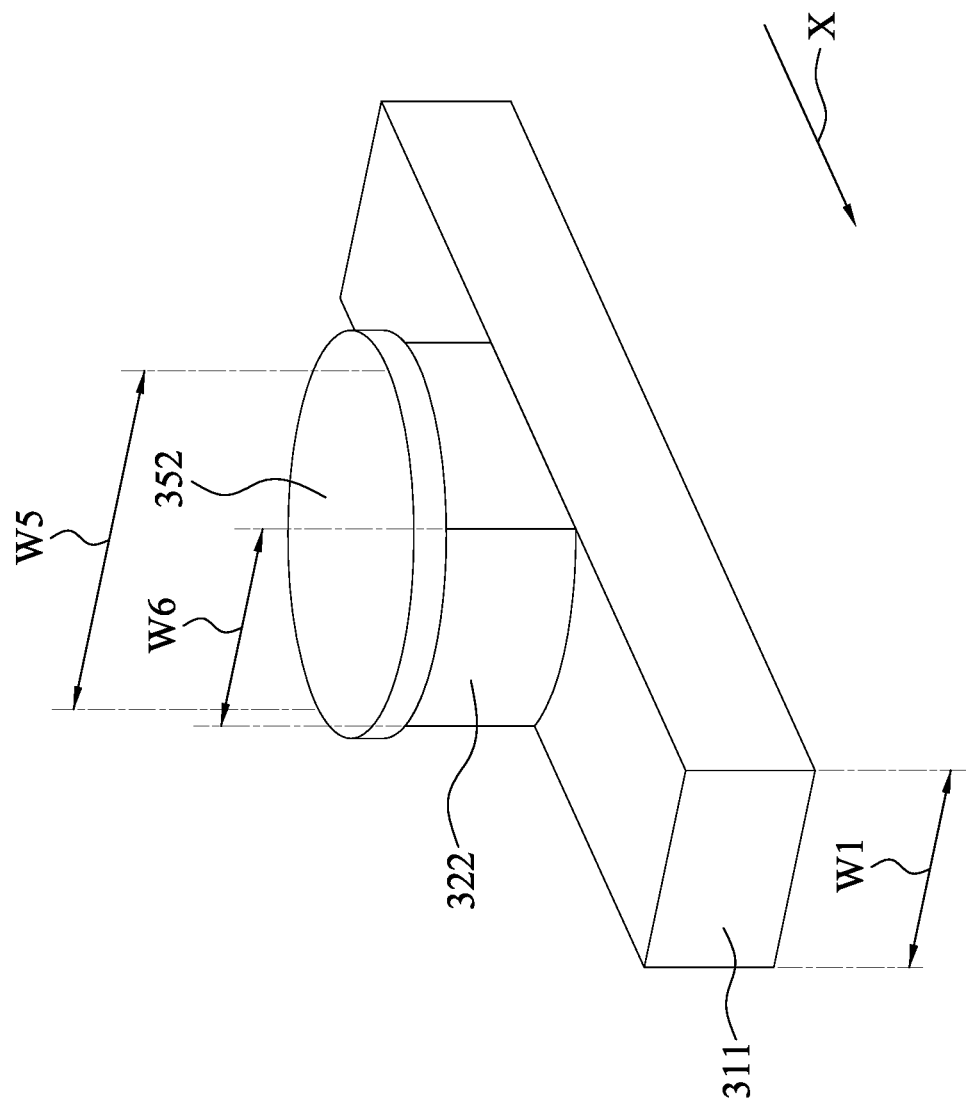
Figure 33:
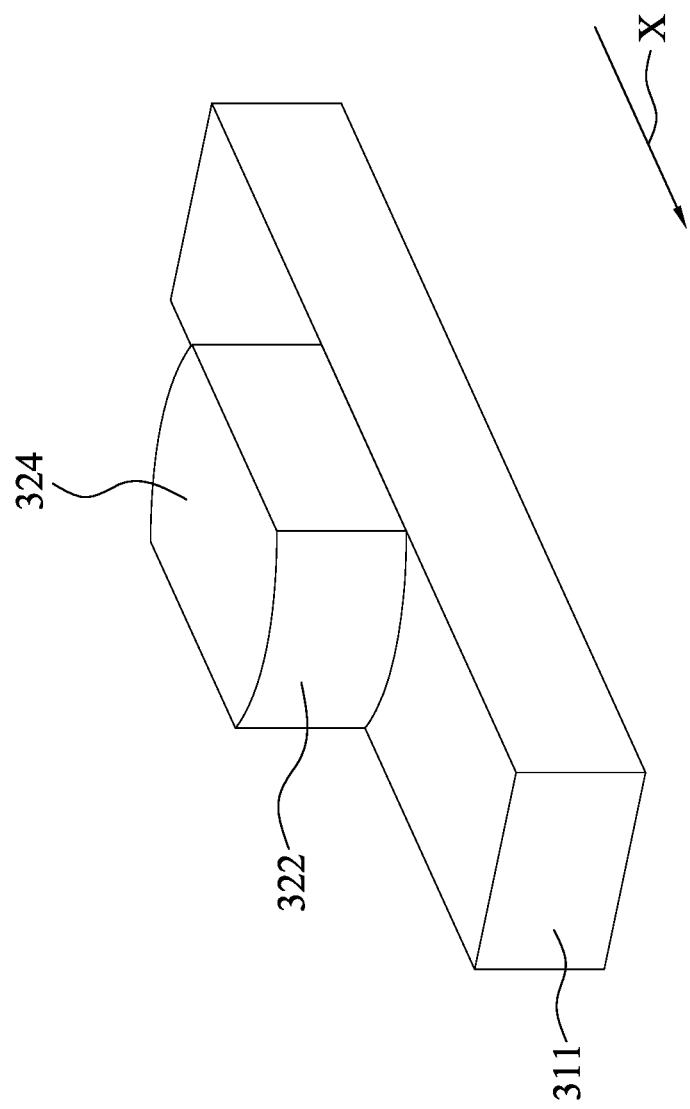

Referring to FIG. 32, a portion of the conductive member 321 is removed, and the conductive via 322 is formed over the first conductive line 311. In some embodiments, a portion of the first conductive line 311 is exposed through the conductive via 322 from a top view perspective. In some embodiments, a width W6 of the conductive via 322 is equal to or less than the width W1 of the first conductive line 311. In some embodiments, the width W6 of the conductive via 322 is equal to or less than the width W5 of the mask 352. Referring to FIG. 33, the mask 352 is removed, and a second end 324 of the conductive via 322 is exposed.

In some embodiments, the method 500 includes step 505, which includes forming a second conductive line 331 over the conductive via 322. Referring to FIG. 34, in some embodiments, the second conductive line 331 extends along a second direction Y different from the first direction X. In some embodiments, the first conductive line 311, the conductive via 322 and the second conductive line 331 are electrically connected to each other and form an interconnected structure 306. In some embodiments, a dielectric layer (not shown) surrounds the interconnected structure 306.

Figure 35:
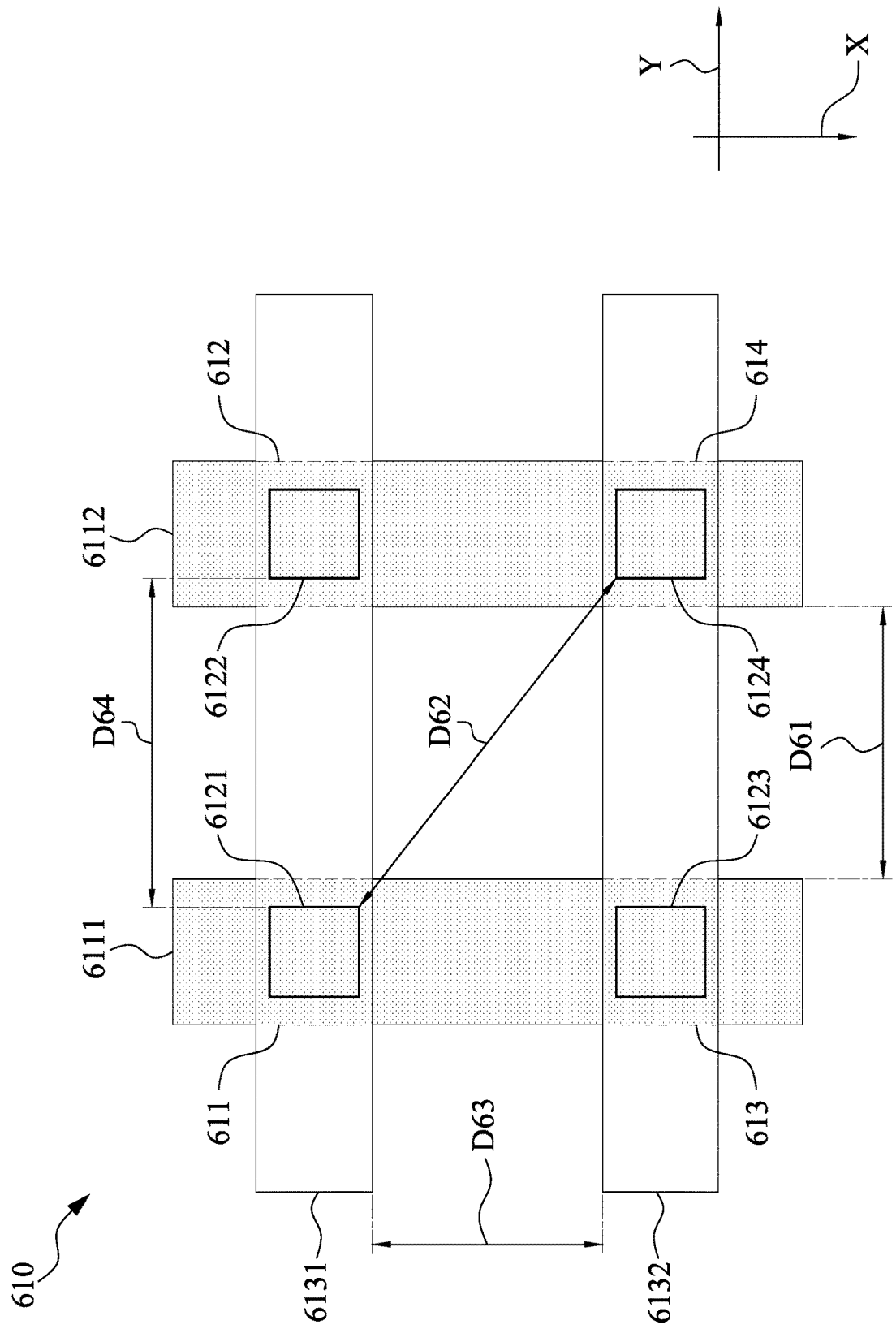
FIG. 35 is a top view of an interconnect structure in accordance with some comparative embodiments.

FIG. 35 is a top view of an interconnect structure in accordance with a first comparative embodiment. As shown in FIG. 35, in the first comparative embodiment, an interconnect structure 610 includes first conductive lines 6111 and 6112, second conductive lines 6131 and 6132 disposed over the first conductive lines 6111 and 6112, and conductive vias 6121, 6122, 6123 and 6124 between the first conductive lines 6111 and 6112 and the second conductive lines 6131 and 6132. The first conductive lines 6111 and 6112 and the second conductive lines 6131 and 6132 have four overlap areas 611, 612, 613 and 614. Each of the overlap areas 611, 612, 613 and 614 is provided with a conductive via 6121, 6122, 6123 or 6124 respectively disposed therein. The first conductive lines 6111 and 6112 extend along a first direction X and the second conductive lines 6131 and 6132 extend along a third direction Z perpendicular to the first direction X.

In the first comparative embodiment, each of the conductive vias 6121, 6122, 6123 and 6124 is a square or a rectangle from a top view perspective, and interior angles of the conductive vias 6121, 6122, 6123 and 6124 from a top view perspective are equal to 90°. In the first comparative embodiment, the conductive vias 6121, 6122, 6123 and 6124 are arranged in a quadrilateral from a top view perspective, the conductive via 6121 and the conductive via 6124 are disposed on opposite corners of the quadrilateral, and the conductive via 6122 is disposed adjacent to the conductive via 6121.

Figure 36:
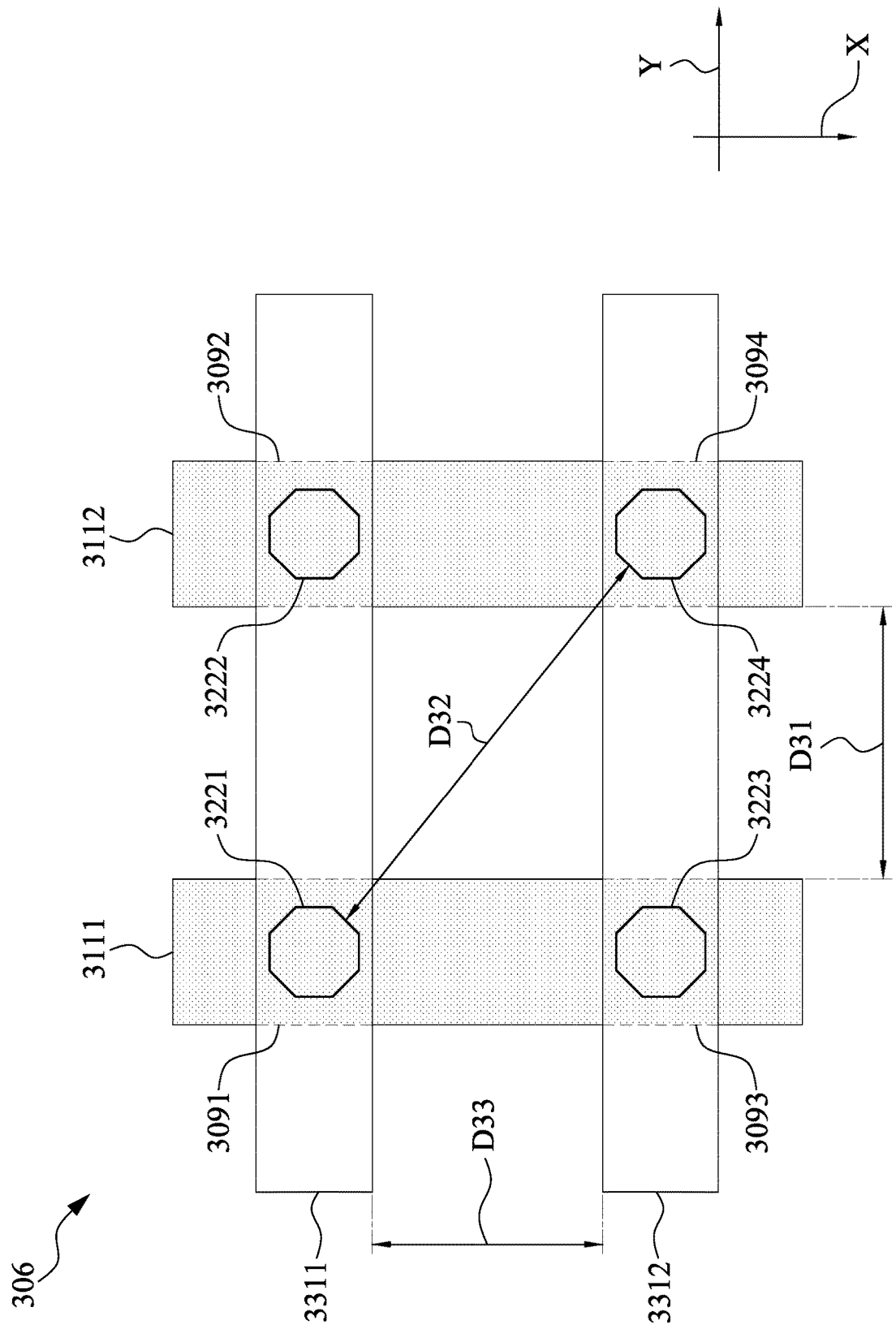
FIGS. 36 and 37 are top views of a portion of a semiconductor structure in accordance with some embodiments of the present disclosure.
Figure 37:
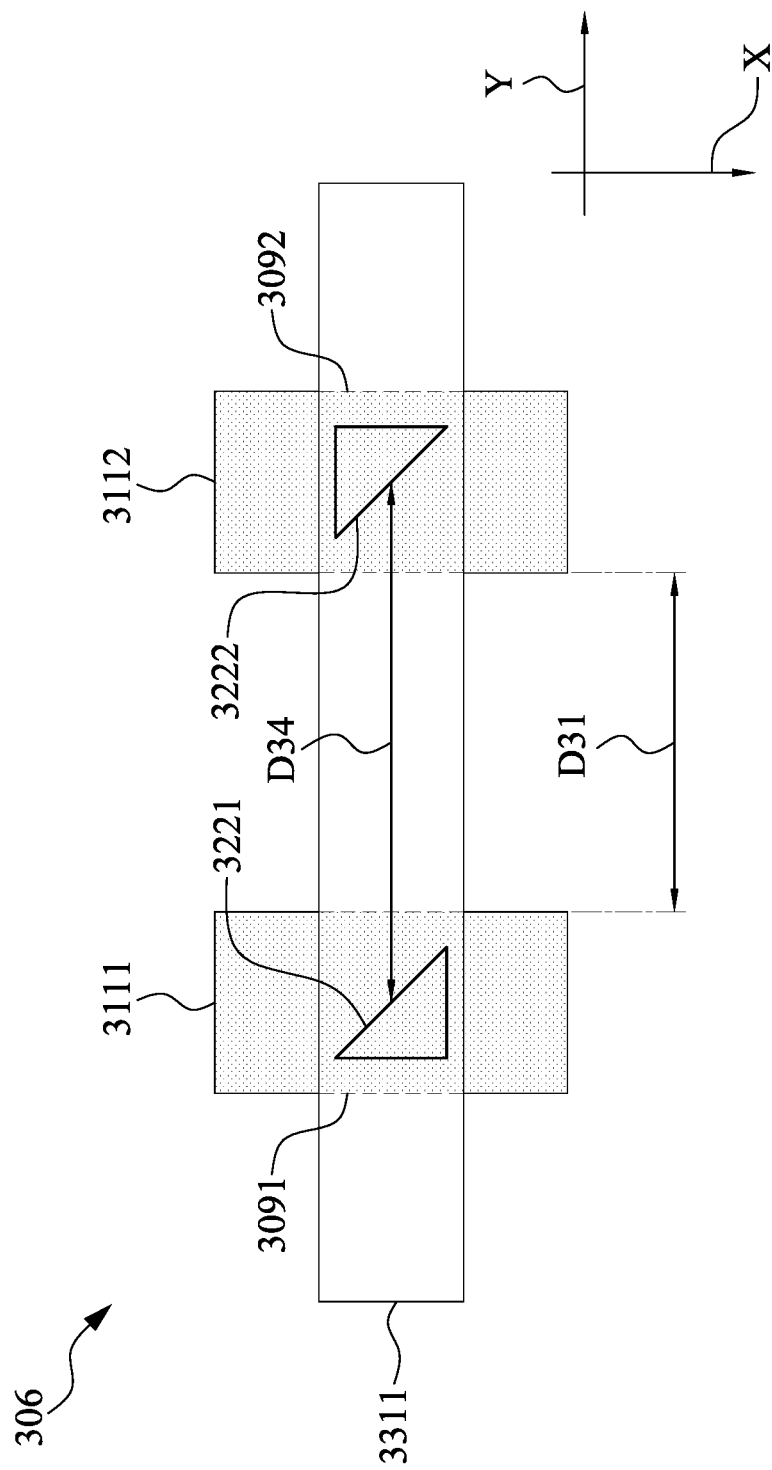

FIGS. 36 and 37 are top views of an interconnect structure of a semiconductor structure in accordance with some embodiments of the present disclosure. Referring to FIG. 36, in some embodiments, an interconnect structure 306 includes first conductive lines 3111 and 3112, second conductive lines 3311 and 3312 disposed over the first conductive lines 3111 and 3112, and conductive vias 3221, 3222, 3223 and 3224 between the first conductive lines 3111 and 3112 and the second conductive lines 3311 and 3312. The first conductive lines 3111 and 3112 and the second conductive lines 3311 and 3312 include four overlap areas 3091, 3092, 3093 and 3094. Each of the overlap areas 3091, 3092, 3093 and 3094 is provided with one of the conductive vias 3221, 3222, 3223 and 3224 disposed therein. The first conductive lines 3111 and 3112 extend along a first direction X and the second conductive lines 3311 and 3312 extend along a second direction Y different from the first direction X.

In some embodiments, the conductive vias 3221, 3222, 3223 and 3224 are arranged in a quadrilateral from a top view perspective, and the conductive via 3221 and the conductive via 3224 are disposed on opposite corners of the quadrilateral. In some embodiments, each of the conductive vias 3221, 3222, 3223 and 3224 includes at least two interior angles substantially unequal to 90° from a top view perspective. In some embodiments, each of the conductive vias 3221, 3222, 3223 and 3224 has a cross-section, and the cross-section is octagonal.

Comparing the embodiment illustrated in FIG. 36 to the first comparative embodiment illustrated in FIG. 35, it can be seen that when a distance D32 between the conductive via 3221 and the conductive via 3224 is equal to a distance D62 between the conductive via 6121 and the conductive via 6124, a distance D31 between the adjacent first conductive lines 3111 and 3112 is less than a distance D61 between the adjacent first conductive lines 6111 and 6112. As such, according to the adjustment of the cross-section of the conductive vias 3221 and 3224, the distance D31 between the adjacent first conductive vias 3111 and 3112 is reduced, and a density of the first conductive lines 3111 and 3112 is increased. Further, when the distance D31 is equal to the distance D61, the distance D32 is greater than the distance D62.

In addition, still comparing the embodiment illustrated in FIG. 36 to the first comparative embodiment in FIG. 35, it can further be seen that when the distance D32 is equal to the distance D62, a distance D33 between the adjacent second conductive lines 3311 and 3312 is less than a distance D63 between the adjacent second conductive line 6131 and 6132. As such, according to the adjustment of the cross-section of the conductive vias 3221 and 3224, the distance D33 between the adjacent second conductive lines 3311 and 3312 is reduced, and a density of the second conductive lines 3311 and 3312 is increased. Further, when the distance D33 is equal to the distance D63, the distance D32 is greater than the distance D62.

Referring to FIG. 37, in some embodiments, an interconnect structure 306 includes first conductive lines 3111 and 3112, a second conductive line 3311 disposed over the first conductive lines 3111 and 3112, and conductive vias 3221 and 3222 between the first conductive lines 3111 and 3112 and the second conductive line 3311. The first conductive lines 3111 and 3112 and the second conductive line 3311 include two overlap areas 3091 and 3092. Each overlap area 3091 and 3092 is provided with a conductive via 3221 and 3222 disposed therein. The first conductive lines 3111 and 3112 extend along a first direction X and the second conductive line 3311 extends along a second direction Y different from the first direction X.

In some embodiments, the conductive via 3221 is adjacent to the conductive via 3222 from a top view perspective. In some embodiments, each of the conductive vias 3221 and 3222 has a cross-section, and the cross-section is triangle. In some embodiments, hypotenuses of the triangles face toward each other.

Comparing the embodiment illustrated in FIG. 37 to the first comparative embodiment in FIG. 35, when a distance D34 between the hypotenuse of the conductive via 3221 and the hypotenuse of the conductive via 3222 is equal to a distance D64 between the conductive via 6121 and the conductive via 6122, the distance D31 is less than the distance D61. As such, according to the adjustment of the cross-section of the conductive vias 3221 and 3222, the distance D31 between the adjacent first conductive vias 3111 and 3112 is reduced, and a density of the first conductive lines 3111 and 3112 is increased. Further, when the distance D31 is equal to the distance D61, the distance D34 is greater than the distance D64 between the conductive via 6121 and the conductive via 6122.

In accordance with some embodiments of the disclosure, a method of manufacturing a semiconductor structure includes forming a first conductive line over a substrate; forming a conductive member over the first conductive line; and forming a second conductive line over the first conductive line and the conductive member. The method further includes removing a portion of the conductive member exposed by the second conductive line to form a conductive via extending between the first conductive line and the second conductive line, wherein the formation of the second conductive line is implemented prior to the formation of the conductive via.

In accordance with some embodiments of the disclosure, a method of manufacturing a semiconductor structure includes forming a stack including a first conductive layer and a conductive member over the first conductive layer; patterning the first conductive layer and the conductive member to form a first conductive line and to align the first conductive line with the conductive member from a top view perspective; and patterning the conductive member to form a conductive via over the first conductive layer.

In accordance with some embodiments of the disclosure, a semiconductor structure includes a first conductive line extending along a first direction and having a first surface; a second conductive line extending along a second direction different from the first direction, disposed above the first conductive line, and having a second surface overlapping the first surface; and a conductive via extending between and electrically connected to the first surface and the second surface. The conductive via includes a first end disposed within the first surface, a second end disposed within the second surface, and a cross-section disposed between the first end and the second end, wherein at least two of interior angles of the cross-section are substantially unequal to 90°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   forming a first conductive line over a substrate;
   forming a conductive member over the first conductive line;
   forming a second conductive line over the first conductive line and the conductive member, wherein the second conductive line has a second surface overlapping and conformal to a first surface of the first conductive line; and
   removing a portion of the conductive member exposed by the second conductive line to form a conductive via extending between the first conductive line and the second conductive line,
   wherein the formation of the second conductive line is implemented prior to the removal of the portion of the conductive member and the formation of the conductive via,
   after the conductive via is formed, the first surface is in contact with a first end of the conductive via, and the second surface is in contact with a second end of the conductive via, and an area of the second surface of the second conductive line is greater than an area of the second end of the conductive via.

2. The method of claim 1, further comprising:
   disposing a dielectric layer over the first conductive line and surrounding the conductive via and the second conductive line.

3. The method of claim 1, further comprising:
   disposing a first dielectric layer over the substrate;
   forming the first conductive line and the conductive member within the first dielectric layer, wherein a top surface of the first dielectric layer is coplanar with a top surface of the conductive member;
   forming the second conductive line over the conductive member and the first dielectric layer prior to the formation of the conductive via; and
   disposing a second dielectric layer to surround the second conductive line and the conductive via.

4. The method of claim 1, further comprising:
   determining an overlap area of the first conductive line and the second conductive line before the formation of the second conductive line,
   wherein a width of the overlap area is greater than a width of the second conductive line.

5. The method of claim 1, wherein the first conductive line extends along a first direction, the second conductive line extends along a second direction different from the first direction, and at least two of interior angles of a cross-section of the conductive via are substantially unequal to 90°.

6. The method of claim 1, wherein the conductive member overlaps and is parallel to the first conductive line.

7. A method of manufacturing a semiconductor structure, comprising:
   forming a stack including a first conductive layer and a conductive member layer over the first conductive layer;
   patterning the conductive member layer to form a conductive member, wherein at least a portion of the first conductive layer is exposed by the conductive member;
   patterning the first conductive layer to form a first conductive line and to align the first conductive line with the conductive member from a top view perspective, wherein the conductive member and the first conductive line are stacked and aligned with each other; and
   patterning the conductive member to form a conductive via over the first conductive layer, wherein at least a portion of the first conductive line is exposed by the conductive via.

8. The method of claim 7, further comprising:
   forming a first mask over the conductive member layer, and
   forming a second mask over the conductive member.

9. The method of claim 8, wherein a width of the second mask is greater than or equal to a width of the conductive member.

10. The method of claim 7, wherein a portion of the conductive via is aligned with the first conductive line.

11. The method of claim 7, further comprising:
forming a second conductive line over the conductive via wherein the first conductive line and the conductive member extend along a first direction, and the second conductive line extends along a second direction different from the first direction.

12. The method of claim 7, wherein a portion of the first conductive line is exposed by the conductive via and the second conductive line.

13. A method of manufacturing a semiconductor structure, comprising:
disposing a first dielectric layer over a substrate;
forming a first conductive line and a conductive member within the first dielectric layer, wherein a top surface of the first dielectric layer is coplanar with a top surface of the conductive member;
determining an overlap area of the first conductive line and a second conductive line before the formation of the second conductive line, wherein a width of the overlap area is greater than a width of the second conductive line;
removing a first portion of the conductive member outside of the overlap area;
forming the second conductive line over the first conductive line, the conductive member and the first dielectric layer, wherein a portion of the second conductive line is disposed in the overlap area; and
removing a second portion of the conductive member exposed by the second conductive line to form a conductive via extending between the first conductive line and the second conductive line.

14. The method of claim 13, further comprising:
disposing a second dielectric layer to surround the second conductive line and the conductive via.

15. The method of claim 13, wherein the conductive via includes a first end and a second end, and a cross-section is disposed between the first end and the second end, wherein at least two of interior angles of the cross-section are substantially unequal to 90°.

16. The method of claim 15, wherein the cross-section of the conductive via is positioned to overlap with the first conductive line or the second conductive line from a top view perspective by a predetermined inset distance.

17. The method of claim 13, wherein a width of the first conductive line is different from a width of the second conductive line.

18. The method of claim 15, wherein the cross-section of the conductive via is a convex polygon, a parallelogram, a trapezoid or an oval.

19. The method of claim 15, wherein the cross-section of the conductive via includes a first pair of sides extending along the first direction and aligned with edges of the first conductive line.

20. The method of claim 15, wherein the cross-section of the conductive via includes a fillet or a chamfer adjacent to a corner of the cross-section.

* * * * *